United States Patent
Horch

(10) Patent No.: US 9,520,404 B2
(45) Date of Patent: Dec. 13, 2016

(54) ASYMMETRIC DENSE FLOATING GATE NONVOLATILE MEMORY WITH DECOUPLED CAPACITOR

(71) Applicant: Synopsys, Inc., Mountain View, CA (US)

(72) Inventor: Andrew E. Horch, Seattle, WA (US)

(73) Assignee: Synopsys, Inc., Mountain View, CA (US)

( * ) Notice: Subject to any disclaimer, the term of this patent is extended or adjusted under 35 U.S.C. 154(b) by 199 days.

(21) Appl. No.: 13/954,383

(22) Filed: Jul. 30, 2013

(65) Prior Publication Data
US 2015/0034909 A1    Feb. 5, 2015

(51) Int. Cl.
*H01L 29/08* (2006.01)
*H01L 27/115* (2006.01)

(52) U.S. Cl.
CPC ..... *H01L 27/1156* (2013.01); *H01L 27/11519* (2013.01); *H01L 27/11558* (2013.01)

(58) Field of Classification Search
CPC .................................................. H01L 27/1156
See application file for complete search history.

(56) References Cited

U.S. PATENT DOCUMENTS

| | | | |
|---|---|---|---|
| 7,095,076 B1 * | 8/2006 | Han | G11C 16/0408 257/316 |
| 7,471,570 B2 | 12/2008 | Morton et al. | |
| 7,718,492 B2 | 5/2010 | Horch | |
| 7,800,156 B2 | 9/2010 | Roizin et al. | |
| 7,859,043 B2 | 12/2010 | Pikhay et al. | |
| 7,939,861 B2 | 5/2011 | Horch | |
| 7,948,020 B2 | 5/2011 | Roizin et al. | |
| 7,983,093 B2 | 7/2011 | Horch | |
| 8,194,468 B2 | 6/2012 | Horch | |
| 8,304,835 B2 | 11/2012 | Bulucea et al. | |
| 8,674,422 B2 | 3/2014 | Horch | |
| 2007/0015332 A1* | 1/2007 | Hemink | H01L 27/115 438/257 |
| 2008/0273361 A1* | 11/2008 | Dudeck | G11C 15/04 365/49.1 |

(Continued)

OTHER PUBLICATIONS

PCT International Search Report and Written Opinion, PCT Application No. PCT/US14/46721, Nov. 7, 2014, 20 pages.

(Continued)

*Primary Examiner* — Vongsavanh Sengdara
(74) *Attorney, Agent, or Firm* — Fenwick & West LLP

(57) ABSTRACT

A nonvolatile memory ("NVM") bitcell includes a capacitor, an asymmetrically doped transistor, and a tunneling device. The capacitor, transistor, and tunneling device are each electrically coupled to different active regions and metal contacts. The three devices are coupled by a floating gate that traverses the three active regions. The tunneling device is formed in a native region to allow for greater dynamic range in the voltage used to induce tunneling. The FN tunneling device is used to erase the device, allowing for faster page erasure, and thus allows for rapid testing and verification of functionality. The asymmetric transistor, in conjunction with the capacitor, is used to both program and read the logical state of the floating gate. The capacitor and floating gate are capacitively coupled together, removing the need for a separate selection device to perform read and write operations.

36 Claims, 16 Drawing Sheets

(56) References Cited

U.S. PATENT DOCUMENTS

| | | | |
|---|---|---|---|
| 2009/0238008 A1* | 9/2009 | Horch | G11C 11/5621 365/185.28 |
| 2009/0267127 A1 | 10/2009 | Chen et al. | |
| 2010/0117121 A1* | 5/2010 | Rolbiecki | H01L 27/0207 257/208 |
| 2010/0244128 A1* | 9/2010 | Bulucea | H01L 21/26513 257/335 |
| 2012/0205734 A1 | 8/2012 | Horch | |
| 2013/0026553 A1 | 1/2013 | Horch | |
| 2013/0193498 A1 | 8/2013 | Horch | |
| 2013/0193501 A1 | 8/2013 | Horch | |

OTHER PUBLICATIONS

Taiwan Office Action, Taiwan Application No. 103125891, Dec. 15, 2015, 6 pages.

* cited by examiner

As Planned

In Process

As Planned

In Process

ASYMMETRIC DENSE FLOATING GATE NONVOLATILE MEMORY WITH DECOUPLED CAPACITOR

BACKGROUND

1. Field of Art

This disclosure generally relates to the field of nonvolatile memory, particularly non volatile memory bitcell layouts.

2. Description of the Related Art

Nonvolatile memory (NVM) refers to memory that persistently stores information bits when not powered. A nonvolatile memory bitcell (NVM bitcell) stores a single bit of data. Some types of NVM bitcells are implemented using transistors with floating gates. The amount of charge residing on a floating gate determines whether the bitcell is storing a logical "1" or a logical "0". The floating gate is referred to as "floating" because the gate is electrically isolated from the surroundings by an oxide or dielectric. Some NVM can store more than one state in the bitcell.

In order to expand applications and reduce costs of memory devices, it is desirable to accommodate a large number of bitcells in a given area. It is also desirable to decrease the cost of fabricating each bitcell by using standard complementary metal-oxide-semiconductor manufacturing processes ("CMOS processes"). Currently available memory devices include EEPROM and FLASH (and eFLASH), both of which have disadvantages. Currently, FLASH has a very small bitcell, but requires steps in addition to the standard CMOS process, which increases the cost of producing the bitcell and possibly changes the performance or characteristics of the produced devices. EEPROM is compatible with standard CMOS processes, but has a relatively large bitcell size, and thus is only suitable for low bit count memories.

SUMMARY

A nonvolatile memory ("NVM") bitcell includes a capacitor, an asymmetrically doped transistor, and a tunneling device each disposed in electrically isolated active regions within a substrate. The three devices are electrically coupled by a single floating gate that traverses the three active regions. The tunneling device is formed in a native region to allow for greater dynamic range in the voltage used to induce tunneling. The tunneling device is used to erase the device, allowing for faster page erasure, and thus allows for rapid testing and verification of functionality. The asymmetric transistor, in conjunction with the capacitor, is used to both program and read the logical state of the floating gate. The capacitor and floating gate are capacitively coupled together, removing the need for a separate selection device to perform read and write operations.

DETAILED DESCRIPTION

Figure 1A:
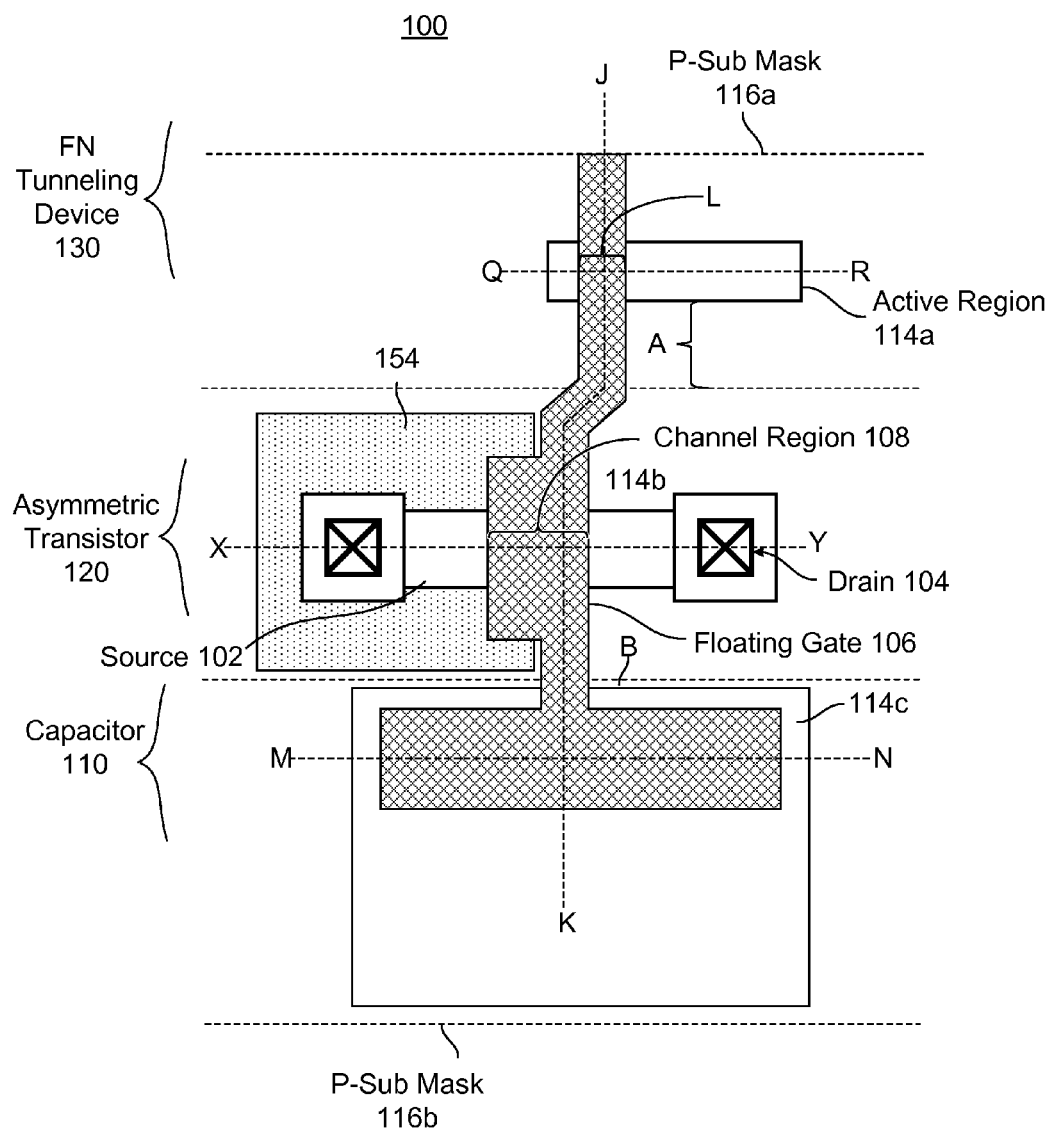
FIG. 1A illustrates a top view of a NVM bitcell according to one embodiment.

Embodiments relate to a nonvolatile memory ("NVM") bitcell (or bit, or bitcell) including three devices: asymmetric transistor, a capacitor, and a Fowler-Nordheim (FN) tunneling device. In the bitcell, the three devices are linked by a single floating gate. In one implementation, the bitcell is erased using the FN tunneling device, and is read and programmed using the asymmetric transistor. Which operation is performed at any given time is determined based on the voltages at the source and drain of the asymmetric transistor, based on the voltage on the active region of the FN tunneling device, and based on the voltage on the active region functioning as one plate of the capacitor.

A NVM memory device can be manufactured including a number of these bitcells (or bits). In one embodiment, the NVM memory device has between 12 k and 512 k bits, and is capable of being reliably used in applications preferring a write cycle endurance of anywhere from 1 to 1000 writes over the lifetime of the NVM memory device.

The NVM memory device and NVM bitcells within have advantages over existing NVM, FLASH, and EEPROM solutions. The NVM memory device has a higher bitcell density than existing EEPROM. The NVM memory device achieves a higher bitcell density per unit area/per unit volume than existing NVM by not requiring a separate selection (e.g., logic, transistor) device to choose which bits to erase or read. Instead, the NVM memory device applies voltages on the asymmetric transistor and the capacitor to choose which bitcells in the NVM memory device are read and programmed or read at any given time. The NVM memory device also simplifies erasing operations and testing, as the FN tunneling device of each bitcell shares a power contact with the FN tunneling devices of other bitcells on the same row. This helps save bitcell space, in addition to allowing for simultaneous erasure of all bitcells sharing that row contact, which significantly speeds testing of the NVM memory device for functionality. At an individual bitcell level, the bitcells of the NVM memory device are smaller than individual planar EEPROM bits and uses a simpler process than FLASH bits require. FN Tunneling is preferred over BTBT, CHEI or CHISEL due to its low power requirement. To decrease erase time, FN Tunneling can be performed on a large number of bits in parallel. For example, with FN Tunneling an entire array of 512K bits can be erased in a single operation. This allows for fast and inexpensive testing of the memory array.

The NVM memory device also has a lower manufacturing cost than a FLASH device because it can be manufactured using a standard complementary metal-oxide-semiconductor manufacturing logic process ("standard CMOS logic process") that is well understood in the art. Thus, NVM memory device does not require process steps in addition to the standard CMOS logic process in generating a FLASH-type device. Hence, NVM memory devices does not result in increase in the cost of manufacturing.

Overall Structure of NVM Bitcell

FIG. 1A illustrates a top view of a NVM bitcell 100 according to one embodiment. For illustrative purposes, all examples are with respect to a floating gate metal-oxide-semiconductor field effect transistor (MOSFET). However, the bitcell 100 may also be implemented as P-type MOSFET. The bitcell 100 includes a floating gate 106 that traverses three separate devices, a capacitor 110, an asymmetric transistor (AT) 120, and a Fowler-Nordheim (FN) tunneling device 130. Each of these devices includes a separate active region 114a, 114b, or 114c of substrate, where the active region of a particular device may be shared with similar devices of other bitcells (not shown) in a NVM memory device. The active regions 114a, 114b, and 114c are isolated from each other by one or more nonconductive regions. Nonconductive regions may be constructed using shallow trench isolations (STI) or other similar mechanisms.

Generally, the floating gate 106 is a conductive layer of material. The floating gate 106 may be a planar layer formed on top of the substrate. Alternatively, the floating gate 106 may be implemented as a multigate transistor such as Fin field effect transistor (or FinFET) (not shown). The FinFET differs from a normal FET in that the floating gate wraps around the conducting channel between the source and drain, creating a structure that looks like a "fin". In the same or a different embodiment, the substrate in which the active regions are formed may be a ultra thin body silicon on insulator (UTB-SOI) having a thickness of approximately 5 nm. Such a design reduces short-channel effects and suppresses leakage by keeping gate capacitance in closer proximity to the whole of the channel.

From a top down perspective, the devices are positioned with respect to the floating gate such that the AT 120 is positioned between the capacitor 110 and the FN tunneling device 130. In a NVM memory device, this allows the first active region 114a of the FN device 130 to be shared between other FN devices of other bitcells. Similarly, this also allows the third active region 114c of the capacitor 110 to be shared between other capacitors of other bitcells. This increases the bitcell density of the NVM memory device.

With regard to the AT 120, the second active region 114b includes both the source 102 and the drain 104 of the AT. The source 102 and the drain 104 are separated by a channel region 108 underneath the portion of the floating gate 106 overlapping with the second active region 114b. The source 102 and drain 104 are formed in portions of the second active region 114b extending around the edge of the portion of the floating gate 106 overlapping with the second active region 114b. The second active region 114b includes a P-well doping underneath the floating gate 106, and also includes asymmetric dopings that differ between the source 102 and drain 104. The AT's dopings and cross sectional structure are further described below with respect to FIG. 1B.

The capacitor 110 is defined by two plates, the first plate being the third active region 114c, and the second plate being the portion of the floating gate 106 extending over the third active region 114c. The capacitor 110 may be formed in an undoped P-sub region 116 (also referred to as a native region), it may also be formed in a doped P-well region or it may be formed in a shallow well depending upon the implementation. In cases where the capacitor 110 is formed in a native region, implants used to dope the substrate in the remainder of the bitcell are blocked during a fabrication process using one or more masks 116b that cover the third active region 114c. This helps ensure that charge carriers from other dopings (such as the P-well doping of the AT 120) do not penetrate into the third active region 114c. The masks 116 used to generate the native region is further described with respect to FIG. 7 below. The capacitor's 110 dopings and cross sectional structure is further described with respect to FIG. 1C below.

A native region is a portion of the substrate or wafer that is undoped from its ordering state from the manufacturer prior to deposition of the floating gate. Generally, wafers are purchased having a particular density of charge carriers (e.g., $10^{15}$ cc/cm$^3$). All other dopings, e.g., P-well 118, N+ 102, 104, 162, N-LDD 152, 160, P-halo 156, P-LDD 264 change the charge carrier density in that region from the native region's original density. In some processes the native region is replaced by a very low doped region with charge carrier densities less than or equal to $10^{16}$ cc/cm$^3$. Masks 116a and 116b are used to form native regions, and in practice the area of the substrate underneath the mask may extend laterally or horizontally to encompass other bitcells as described further below.

The extent of the masks 116 determines the size of the native regions. As the masks 116 extend past the edge of the first 114a and third 114c active regions, there are regions of the substrate that are native regions that are not part of the active region (not separately labeled). These regions are referred to as non-active native regions or isolation regions. The distance between the edge of an active region that is a native region such as the first 114a and third 114c active regions, and the edge of the non-active native regions as determined by the mask 116a or 116b serves to electrically isolate the first 114a and third 114c active regions from the doped second active region 114b. These distances are illustrated as distances A and B in FIG. 1A, with respect to the first 114a and third 114c active regions, respectively. The electrical isolation afforded by these non-active native regions improves the performance of the first 114a and third 114c active regions at the expense of costing additional substrate space to provide that isolation. Performance may be measured, for example, based on the voltages that can be applied to the first 114a and third 114 active regions without inducing diode breakdown. For example, increased isolation (e.g., increased non-active region distance A or B) allows for higher voltages without inducing diode breakdown. During manufacturing, a tradeoff is made between the size of any non-active native regions and the performance desired out of the device. In one embodiment, the first active region 114a has a larger non-active region enclosure than the third active region 114c, for example distance A is a longer than distance B.

In another embodiment the FN tunneling device 130 and capacitor 110 are placed in a shallow well of opposite doping polarity to the well of the read device. A shallow well is a well where the depth of that well as implanted is above the depth of the isolation dielectric (typically shallow trench isolation or STI). By making the depth of the shallow well as implanted above the depth of the STI, the implant is effectively self-aligned to the STI since any dopant implanted into the STI is locked in the STI and has no effect on any device. The shallow well can be implanted "on top" of another well so long as the shallow well's dopant concentration is significantly higher than the well it is counter doping.

The FN tunneling device 130 is formed of the first active region 114a and the floating gate 106. The FN tunneling device 130 is formed in a native region of the first active region 114a. As with the capacitor 110, the floating gate 106 extends at least partially over the first active region 114a. In contrast, however, the portion of the floating gate 106 over the first active region 114a is narrower and smaller in surface area than the portion of the floating gate over the third active region 114c. Consequently, dopings in the first active region 114a underneath this portion of the floating gate 106 electrically short the first active region 114a on either side of the floating gate 106. This electrical short allows a wide range of voltages to be applied to the first active region 114a to induce FN tunneling, as well as allowing the first active region 114a to be shared between FN tunneling devices of other bitcells using as few as a single electrical contact. The FN tunneling device 130 is formed in a native region using a mask 116a both to ensure there is an electrical short between the active regions on either side of the gate 106 and to increase the voltage that can be applied to active region 114a without diode breakdown behavior occurring. The FN tunneling device's 130 cross sectional structure is further described with respect to FIG. 1D below.

The bitcell 100 is associated with at least four separate electrical contacts that can apply voltage/current to the bitcell 100, thereby affecting the voltage level and amount of charge on the floating gate 106. The source 102 is electrically coupled to a first contact, the drain 104 is electrically coupled to a second contact, the capacitor 110 is electrically coupled to a third contact, and the FN tunneling device is electrically coupled to a fourth contact. The third contact can be shared between multiple capacitors of multiple bitcells, and the fourth contact can be shared between multiple FN tunneling devices of multiple bitcells. These contacts are not separately labeled for clarity, and are further described with respect to FIGS. 9A and 9B.

Figure 1B:
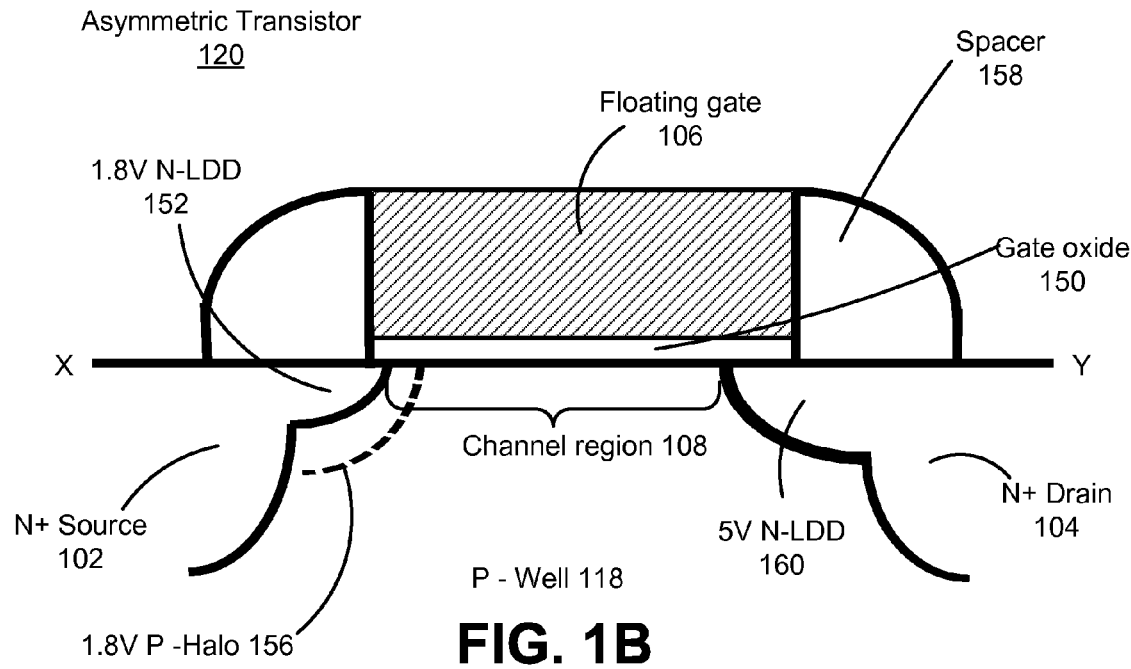
FIG. 1B is a cross sectional view of an asymmetric transistor of the NVM bitcell taken along line X-Y of FIG. 1A, according to one embodiment.
Figure 1C:
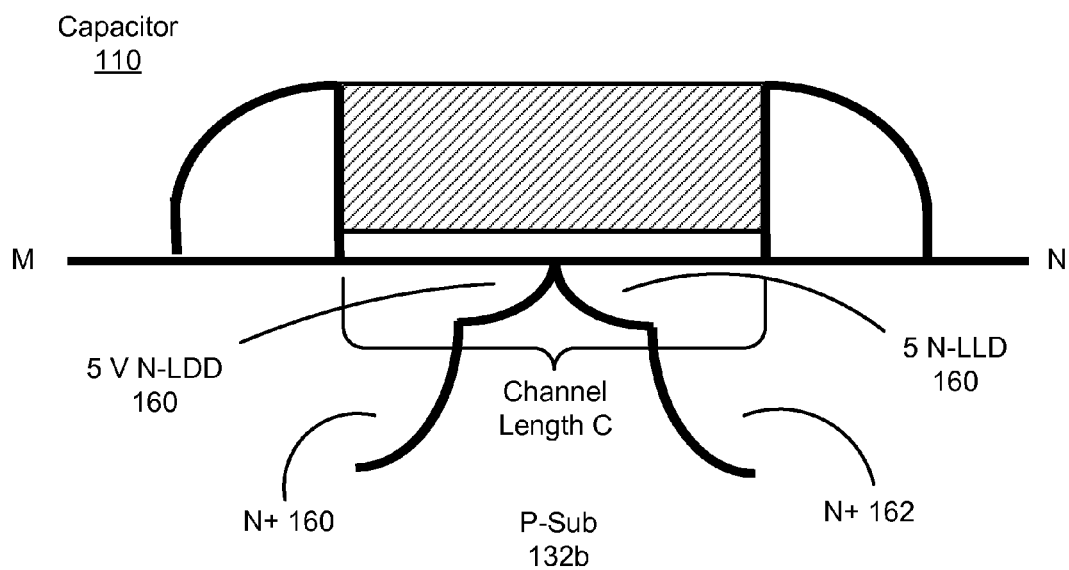
FIG. 1C is a cross sectional view of a capacitor of the NVM bitcell taken along line M-N of FIG. 1A, according to one embodiment.
Figure 1D:
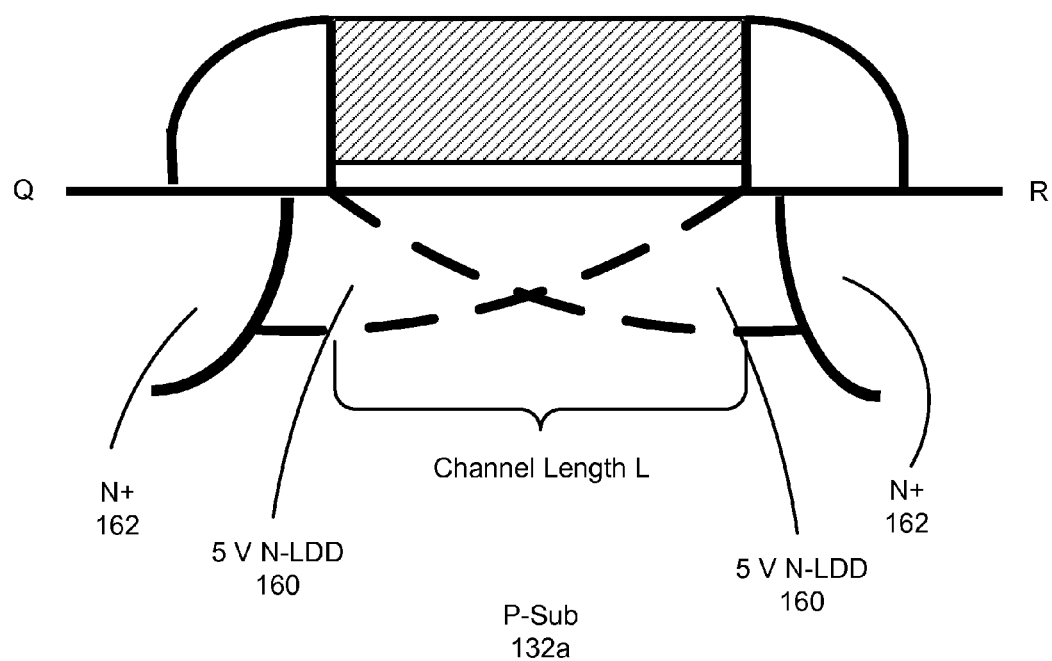
FIG. 1D is a cross sectional view of a FN tunneling device of the NVM bitcell taken along line Q-R of FIG. 1A, according to one embodiment.
Figure 1E:
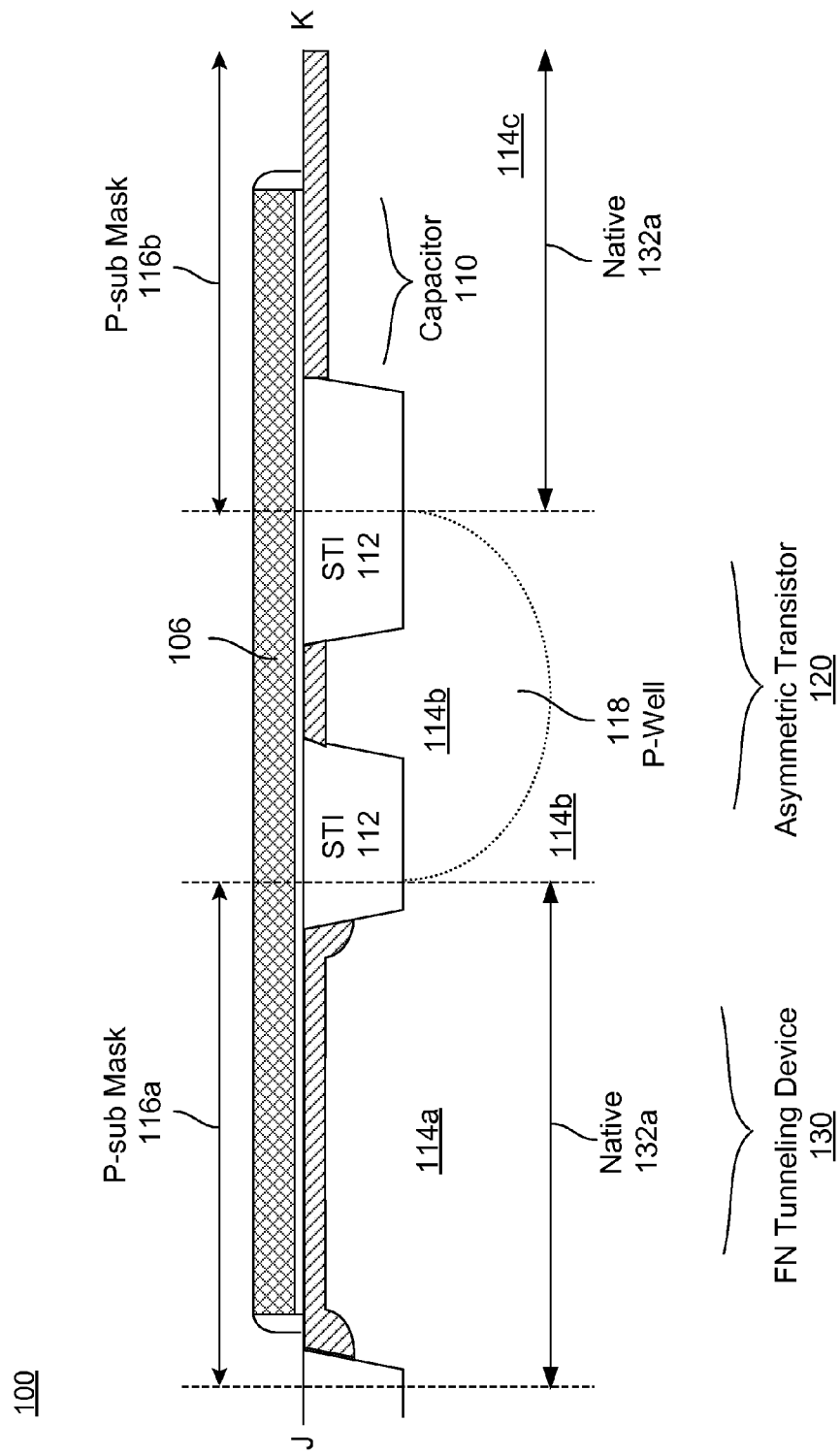
FIG. 1E is a cross sectional view of the NVM bitcell taken along line J-K of FIG. 1A, according to one embodiment.

FIG. 1E is a cross sectional view of the NVM bitcell according to one embodiment. FIG. 1E is taken along line J-K of FIG. 1A, across all three active regions 114a through 114c. The active regions 114 are separated by one or more nonconductive regions 112. In bitcell 100, both the capacitor 110 and the FN tunneling device 130 are formed in native regions 132. Using a native region 132 decreases electrical coupling through the substrate between the different devices and bitcells. Due to the potential for later implants to penetrate into the native regions 132, the bitcell 100 is formed using one or more masks 116 that extend beyond the extent of the first 114a and third 114c active regions into the nonconductive regions 112. The edge of the third active region 114c is not shown as the third active region 114c may be shared with the capacitor (not shown) of another bitcell (not shown) as further described below. In some embodiments the portion of the floating gate over the FN tunneling device 130 extends out on top of the STI region 112.

Example Structure and Operation of Asymmetric Transistor

Asymmetric transistor 120 has different dopings at the source 102 and drain 104, allowing the AT 120, in conjunction with capacitor 110, to be used as both a read device and a programming device. FIG. 1B is a cross sectional view of an asymmetric transistor of the NVM bitcell taken along line X-Y of FIG. 1A in the second active region 114b, according to one embodiment. Floating gate 106 sits on top of gate oxide 150. The floating gate 106 is surrounded by one or more spacers 158. The spacers may be made of an oxide or another nonconductive material. The gate oxide 150 rests on top of the second active region 114b. Active regions 114 may be a silicon substrate or a silicon-on-insulator (SOI) type substrate.

The second active region is doped to create a P-well 118 having approximately $10^{17}$ charge carriers (cc) per cubic centimeter ($cm^3$) beneath the floating gate 106. The source 102 and drain 104 surround the P-well 118, and each is attached to a separate electrical contact (not shown). When appropriate bias voltages are applied at the source 102 and drain 104 (e.g., when the AT 120 is turned "on"), a channel 108 of charge carriers is formed near the surface of the P-well 118 underneath the floating gate 106. Charge carrier flow is dictated by a number of factors including, for example, the voltages on the source 102 and drain 104, the number of charge carriers (e.g., electrons, holes) on the floating gate 106, the voltage on the capacitor 110, the doping of the source 102 and drain 104, the doping of the P-well 118, the thickness of the gate oxide 150, and other characteristics of the bitcell 100 such as dimensions of the various components and the materials used.

As introduced above the transistor 120 is asymmetric such that the source 102 and drain 104 have different dopings (or implants) of charge carriers from each other. There are commonalities, however, between the dopings. Both the source 102 and drain 104 include similar N+ dopings, having approximately $10^{20}$ cc/$cm^3$, where the N+ dopings extend at least partway under the spacers 158. Regarding the differences between the dopings, the embodiment illustrated in FIG. 1A-1E is for a hybrid 1.8V/5V bitcell. This means that some devices in the process may have a gate oxide of appropriate thickness between the floating gate and the substrate to support 1.8V operation, whereas other devices may have a gate oxide of appropriate thickness between the floating gate and the substrate to support 5V operation. The 1.8V devices and 5V devices also use different LDD implants. AT 120 specifically uses the gate oxide from a 5V implementation in order to have sufficient gate oxide thickness to support the desired retention charge on the floating gate. Generally, 1.8V gate oxides are so thin that direct tunneling can occur, causing unacceptable gate leakage.

To implement this asymmetry, the source 102 includes a 1.8V NMOS implant. The 1.8V NMOS implant typically includes two implants, either a lightly doped drain (LDD) or source-drain extension (S/D) implant, and a halo implant. The LDD and S/D extension implant are the same implant, the implant is called an LDD implant if the concentration of charge carriers is $10^{19}$ cc/cm$^3$, whereas if the charge carrier concentration is $10^{20}$ cc/cm$^3$ it is instead called a S/D extension implant due to the charge carrier concentration being similar to the source 102 and drain 104 regions. The halo implant is typically of the opposite polarity of the LDD or S/D extension implant. The halo implant typically has a charge carrier concentration of $10^{18}$ cc/cm$^3$, and is implanted with a higher energy and at a slight angle so that it forms a "halo" around the source 102 or drain 104 regions within the substrate. The combined N-LDD (or N-SD extension) and P-Halo implant provides a highly doped junction that allows for improved CHEI or CHISEL injection (described further below). The drain region 104 includes a 5V N-LDD implant. The 5V N-LDD implant it designed to handle a higher voltage that the 1.8V junction. The 5V N-LDD has a charge carrier concentration of $10^{19}$ cc/cm$^3$, and is implanted at either a higher energy and angle or is diffused with a heat step to grade the junction, thus allowing for higher voltages. The 5V N-LDD implant extends under the floating gate within the second active region much further than the 1.8V LDD (or S/D) implant. Although the embodiment illustrated is for a 1.8V/5V bitcell, other common voltage combinations include: 1.8V/3.3V, 1.2V/2.5V, 1.2V/3.3V, 1V/2.5V, 1V/3.3V and many others. The above described concept of configuring and mixing gate oxide thicknesses, implant types, and implant techniques to allow the AT 120 to operate with different voltages at the source 102 and drain 104 can be used in many other kinds of bitcells incorporating an AT 120.

The different implants on the source 102 and drain 104 affect the threshold voltage $V_T$ of the AT 120 such that the AT 120 has different operating behavior under forward and reverse bias conditions. This allows the AT 120 to be used as both a read device and a program device without the need for a separate selection device (e.g., another transistor). Operation of the AT 120 in conjunction with the remainder of the bitcell 100 is described below.

Figure 2:
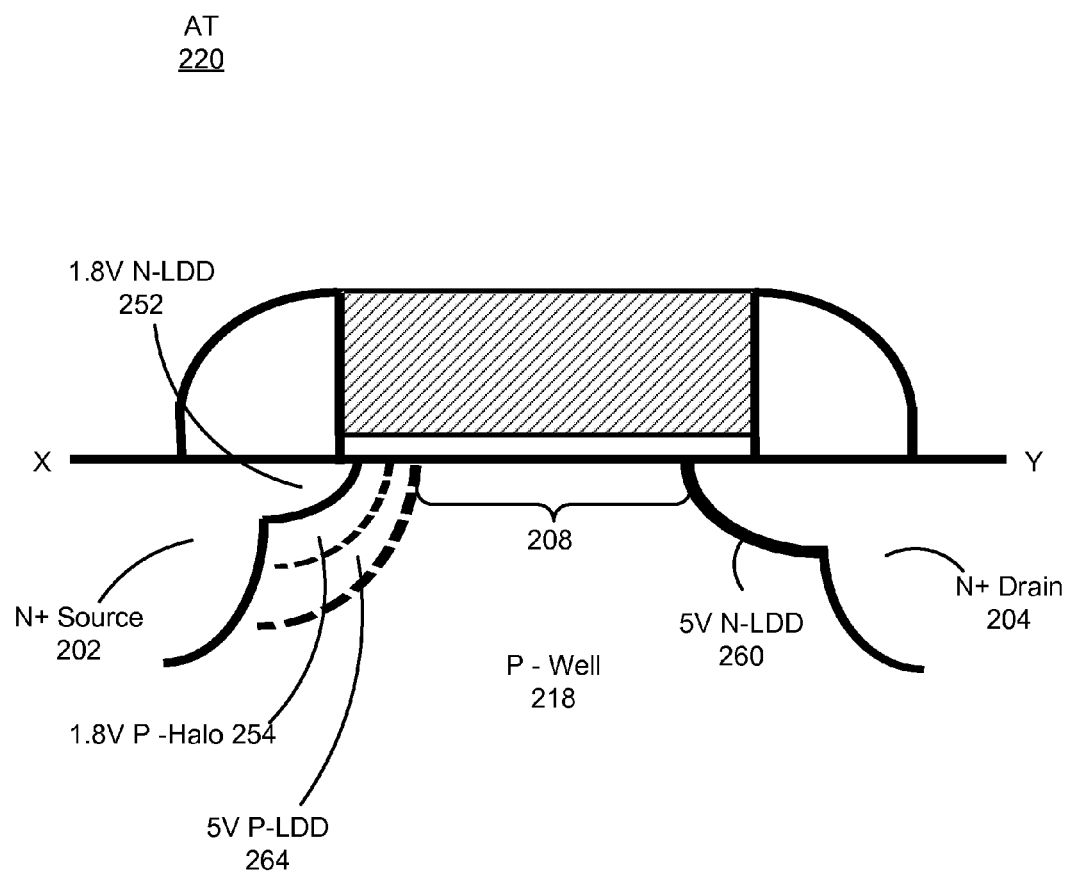
FIG. 2 is a cross sectional view of an alternate construction for an asymmetric transistor of an NVM bitcell according to one embodiment.

Other implementations of an AT 120 may have different dopings at the source and drain. For example, FIG. 2 is a cross sectional view of an alternate construction for an AT 220 of an NVM bitcell 200 according to one embodiment. As with source 102 of AT 120, source 202 of AT 220 includes a 1.8V N-LDD 252 and a 1.8V P-halo 254. Further, source 202 also includes a 5V P-LDD 264 implant. Drain 204 is similar to drain 104 and includes a 5V N-LDD 260. AT 220 is formed in a P-well 218 and has a channel region 208. In yet another implementation, a functional but less efficient NVM bitcell can be constructed using symmetric doping on the source and drain of the transistor. Due to the symmetry of doping, this transistor would not be referred to as an "asymmetric transistor", but would perform all the same functions as indicated herein.

Other implementations of AT 120 alter the P-Well 118. In some instances, the bitcell may operate more efficiently if the P-Well 118 has a higher doping concentration. The P-Well doping concentration may be increased by adding additional and/or different P-type implants that are not normally used in 5V NMOS devices. For example, the P-well may be doped to include both a 5V and a 1.8V P-implant. As another example, the P-Well 118 may be formed using a 1.8V implant rather than a 5V implant as described above. As another example, a portion of the P-well 118 may be formed using a 1.8V implant, and another portion of the P-well 118 may be formed with a 5V implant. As another example, the P-well may include a $V_T$ adjustment implant.

Example Structure and Operation of FN Tunneling Device

The FN tunneling device allows for erasure of an entire NVM memory device quickly and at low current cost. FIG. 1D is a cross sectional view of a FN tunneling device 130 of the NVM bitcell 100 taken along line Q-R of FIG. 1A in the first active region 114a, according to one embodiment. Above the substrate, the bitcell is the same as in FIG. 1B along this cross section, except for the width of the floating gate 106. Within the first active region 114a, the devices differ. The first active region 114a includes a N+ implant 162 that extends partway underneath the spacers 158 and a 5V N-LDD implant 160 that extends all the way underneath the floating gate 106 to the extent that the implant 160 overlaps itself underneath the floating gate 106. In an alternate embodiment the doped region under the FN tunneling device 130 is formed using a shallow well implant.

The first active region 114a is formed in a native region 132a. Forming the FN tunneling device 130 in a native region 132a creates a diode-like junction underneath the floating gate 106 capable of handling high voltages. FN tunneling is activated in the FN tunneling device 130 by applying a large positive voltage (e.g., 9-15 V) to the first active region 114a. More specifically, the voltage need to erase the floating gate 106 depends on the thickness of the gate oxide and the desired erase time. For a 5V gate oxide having a thickness of approximately 125 Angstroms, FN Tunneling is expected to occur in the 13V-17V range. For a 3.3V gate oxide of having a thickness of approximately 75 Angstroms, FN Tunneling is expected to occur in the 8V-10V range. FN Tunneling induces electrons to tunnel from the floating gate to the first active region 114a, increasing the voltage on the floating gate, thereby erasing data stored in the floating gate, in this implementation. The amount of voltage on the contact determines how much FN tunneling occurs, thus by changing the voltage on the contact, the amount and rate of FN tunneling can be controlled.

In one embodiment, the erase operation is performed as a bulk operation, that is, an operation that is performed on a large number of bits in one pass, whereas the program (or write) operation is performed on a bit by bit basis. For example, an erase operation would erase a page (e.g., one thousand bits) by inducing FN Tunneling in devices like FN tunneling device 130 to cause them all to go into the "on" state (e.g., have a high floating gate voltage). A program operation could then selectively program any single floating gate that to set it to the "off" state (e.g., having a low floating gate voltage).

When any positive voltage is applied to the first active region 114a, electrons are depleted from doped region 160, creating depletion regions underneath the floating gate. Depending upon the construction of the bitcell, if these depletion regions grow large enough (e.g., if sufficient positive voltage is applied), the depletion region will rise in height from the native region up to the channel directly underneath the floating gate 106, eventually extending across the entire channel length L of the first active region 114a under the floating gate 106. In this circumstance, the short under the floating gate 106 is terminated, and FN tunneling is prevented.

Overlapping the 5V N-LDD implant underneath the floating gate 106 delays the growth of the depletion region to higher voltages by simply having more charge carriers present in the region to deplete, thereby providing a larger voltage range to use to perform FN tunneling. Forming the FN tunneling device 130 in a native region enhances this effect by providing relatively few counter-doped charge carriers (e.g., holes) that would otherwise interfere with the N-LDD implant 160 overlap and accelerate the growth of the depletion region and prevent FN tunneling.

To further facilitate FN tunneling at high voltages, the FN tunneling device 130 is configured to have a narrow floating gate 106 over the first active region 114a with a narrow channel (length L). If the floating gate 106 is wider (e.g., if channel length L is increased) FN tunneling shuts off at lower voltages (e.g., below 14 V). As the FN tunneling device is configured to operate under higher voltages than the capacitor 110, the native region 132a around the portion of the native region 132a under the floating gate may be configured to be larger in surface area than in the capacitor. The larger the native region 132a enclosure around or at least partially surrounding the floating gate (in a top down view), the higher the diode breakdown of that junction.

Figure 3:
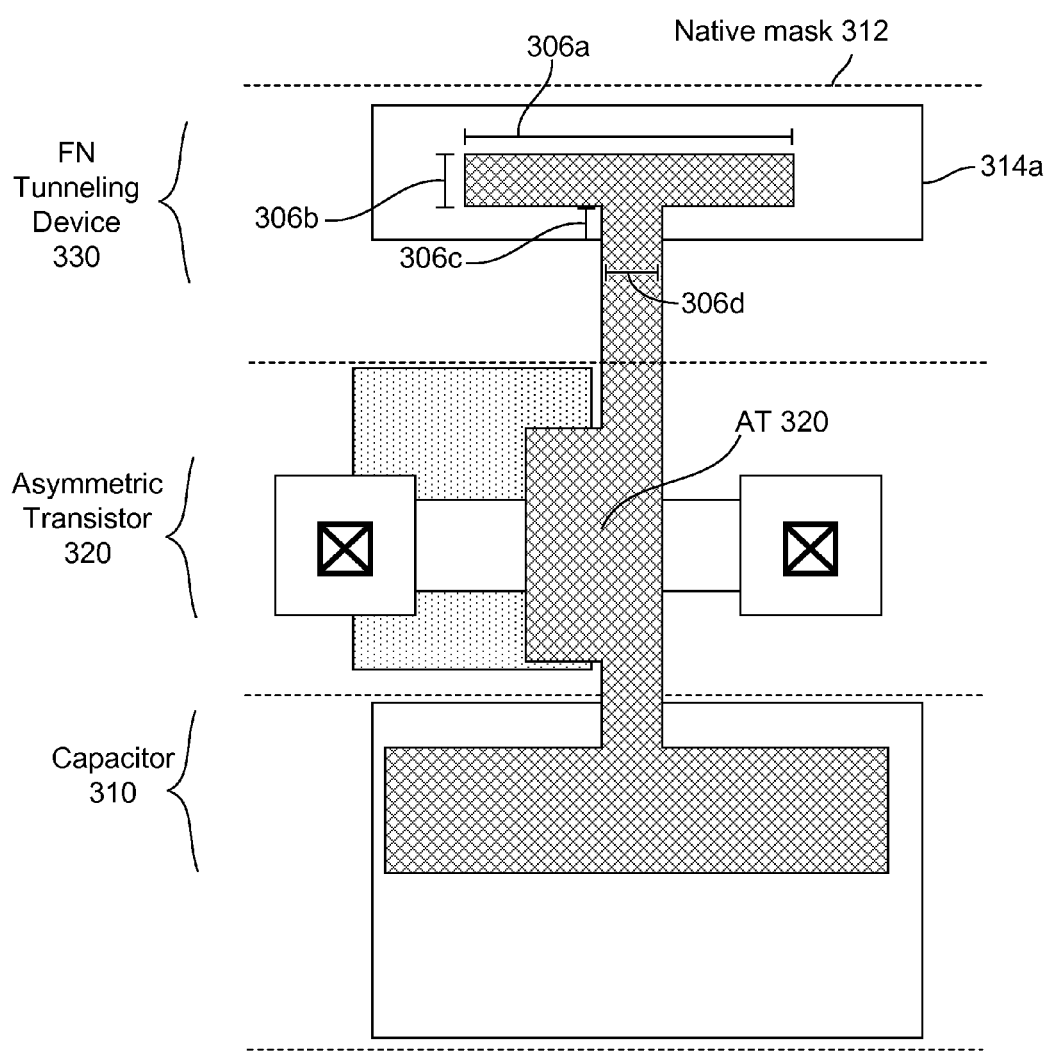
FIG. 3 is a top view of an alternate construction for the FN tunneling device of the NVM bitcell according to one embodiment.

FIG. 3 is a top view of an alternate construction for the FN tunneling device 330 where shorting the FN tunneling device 330 is not feasible. In some implementations, it is not feasible to short the FN tunneling device in the first active region under the floating gate, as is done in the implementation illustrated in FIG. 1D. This is a problem in implementations where the highest voltage implant in any device in the bitcell is 2.5V. This can be the case with particular implant processes, for example processes where the 2.5 V N-LDD implant cannot be implanted with sufficient reach under the floating gate so as to overlap with itself. Despite this, a functional NVM bitcell can still be constructed, as described herein with reference to FIG. 3.

In the implementation of FIG. 3, the portion of the floating gate 306 over the first active region 314a has an expanded perimeter relative to the FN tunneling device 130 illustrated in FIG. 1A. The floating gate 306 perimeter is twice length 306b plus twice length 306a plus twice length 306c minus length 306d. Other perimeters are also possible based on other floating gate shapes (not illustrated). The expanded perimeter for the floating gate 306 of FN tunneling device 330 increases the area underneath the floating gate 306 where implants, such as a 2.5V N-LDD implant, penetrate. This allows for a larger area of overlap between the LDD implant in the first active region 314a and gate. The floating gate 306 does not traverse the entirety of the first active region 314a in a direction perpendicular to line Q-R. This allows the first active region 114a to be shared among a number of FN tunneling devices of a number of bitcells in an NVM memory device even if the LDD does not short under the gate.

Example Structure and Operation of Capacitor

FIG. 1C is a cross sectional view of a capacitor of the NVM bitcell according to one embodiment. FIG. 1C is taken along axis M/N from FIG. 1A in the third active region 114c. The portion of the capacitor 110 above the third active region 114c is the same as in FIGS. 1B and 1D along this cross section, with the exception of the width of the floating gate 106. Within the third active region 114c, the devices differ with regards to size and doping. The third active region 114c includes an N+ implant 162 that extends part-way underneath the spacers 158 on all sides. The third active region 114c also includes a 5V N-LLD implant 160 that extends part way or all the way underneath the floating gate 106 on all sides except where the floating gate is used to connect the capacitor to the read device.

The capacitance of the capacitor 110 of the capacitor 110 between the floating gate 106 and third active region 114c is determined by the extent of the overlap between the floating gate 106 and the third active region 114c. The portion of the floating gate 106 extending over the third active region 114c is shaped such that dopings of charge carriers into the third active region 114c are able to penetrate underneath that portion of the floating gate 106. Increasing the floating gate's size over the third active region 114c without also increasing the extent of the 5V LDD implant 160 does not measurably increase capacitive coupling. Therefore, to reduce bitcell size, implant 160 and the floating gate shape 106 are configured to ensure that LDD implant 160 extends under the floating gate 106 as much as possible, if not all the way underneath the entirety of floating gate 106. Ideally the LDD's merge under the gate.

As introduced above, the third active region 114c may be formed as a native region 132b or as a P-well region. When a positive voltage is applied to the third active region 114c, a depletion region is formed in the third active region 114c that grows in size as the voltage is increased. If the depletion region reaches the surface of the substrate, that portion of the capacitor is no longer capacitively coupled to the floating gate 106 due to the lack of charge carriers in the depletion region. Thus, there is a limit to how high in voltage the third active region 114c can be pulled before capacitive coupling falls off due to depletion. This in turn limits how high in voltage the floating gate 106 can be capacitively coupled by an applied voltage.

Forming the capacitor 110 in a native region advantageously allows for larger capacitive surface areas, because the native region lack counter-doped charge carriers. As with the FN tunneling device 130 above, the presence of fewer counter-doped charge carriers forestalls the growth of the depletion region under an applied voltage. Thus, the portion of the floating gate over the third active region 114c can be comparatively large while still providing functional capacitive coupling at high voltages. In contrast, forming the capacitor in a P-well region provides a large number of counter-doped charge carriers to accelerate the growth of the depletion region in the presence of an applied voltage. To form an equivalently functional capacitor, the floating gate 106 is generally reduced in width relative to its native region counterpart to ensure that additional 5V N-LDD charge carriers can be implanted all the way under the narrowed floating gate 106 to counteract the P-well counter-dopants.

Figure 4A:
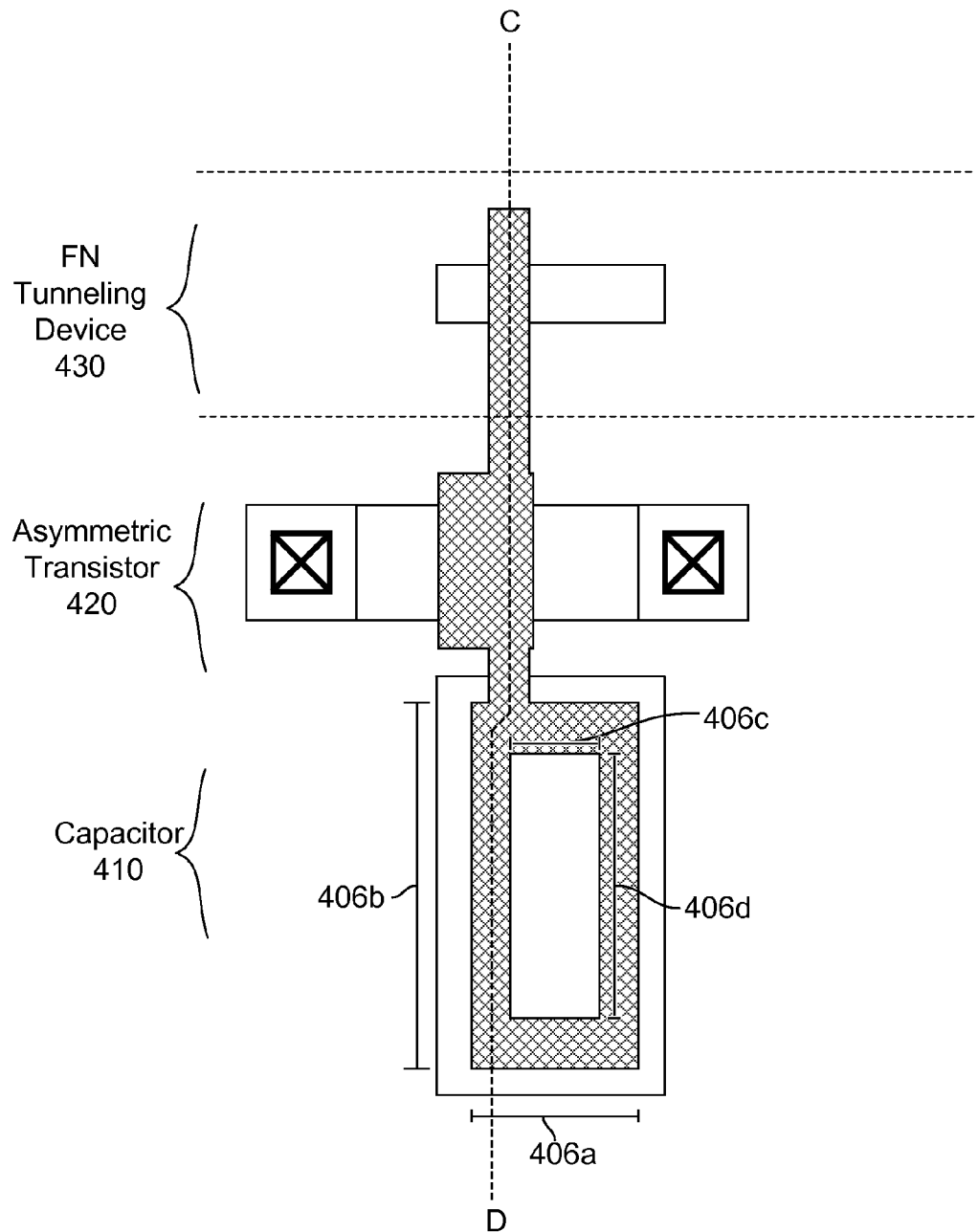
FIG. 4A is a top view of an alternate construction for the capacitor of the NVM bitcell according to one embodiment.
Figure 4B:
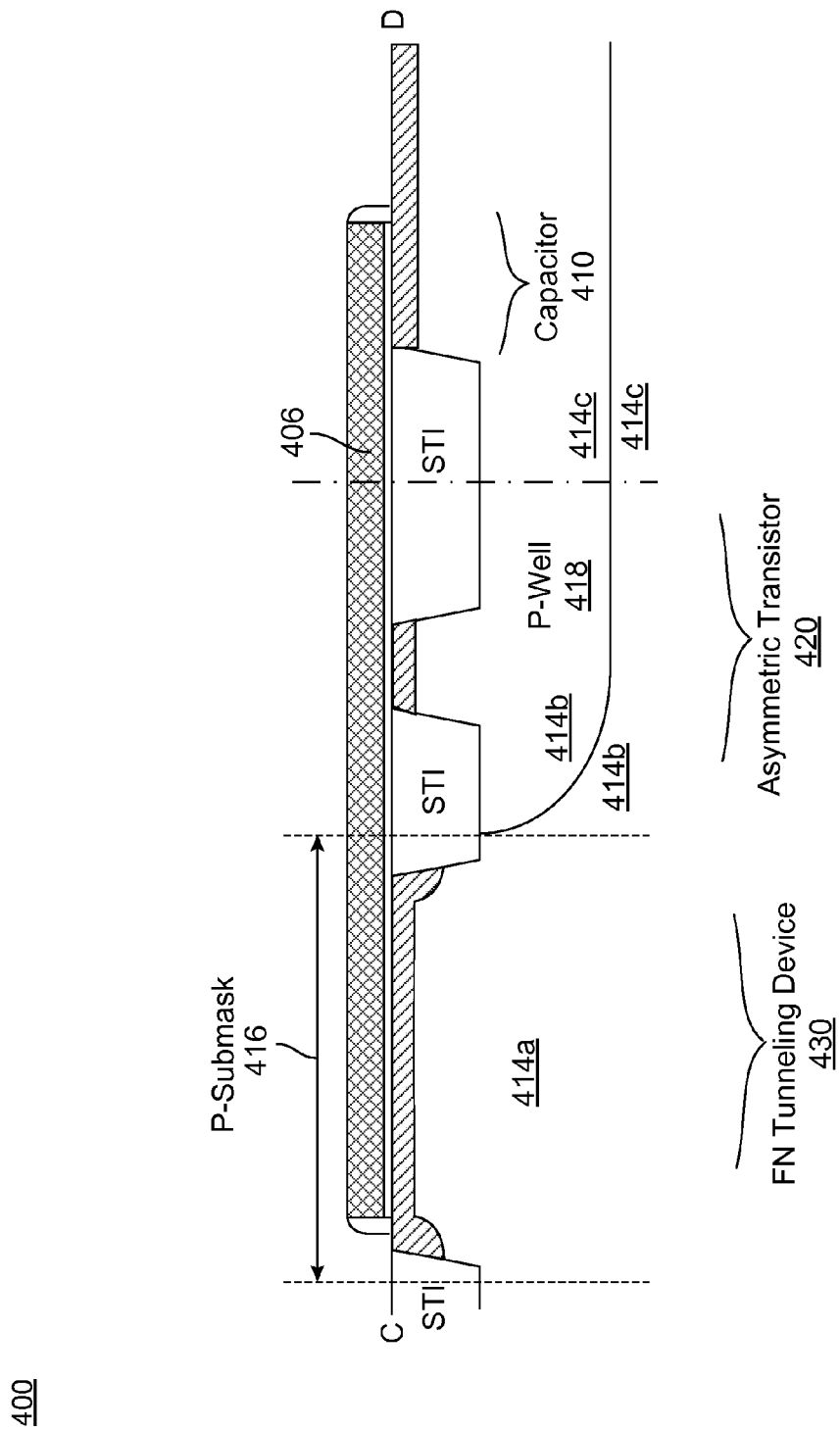
FIG. 4B is a cross sectional view of an alternate construction for the capacitor of the NVM bitcell taken along line C-D of FIG. 4A, according to one embodiment.

FIGS. 4A and 4B illustrate an implementation of a bitcell 400 where the capacitor 410 is formed in a P-well region 418, rather than a native region. FIG. 4A is a top view of bitcell 400. To counteract the additional counter-dopants (e.g., holes) in the P-well 418 that accelerate depletion region growth, the portion of the floating gate 406 over the third active region is configured to be below a certain width such that the electrons of the 5V N-LDD implant penetrate all the way underneath that portion of the floating gate 406. This counteracts the presence of the additional holes under an applied voltage, maintaining capacitive coupling even at high applied voltages (e.g., in the range of 7-10V). For example, the floating gate 406 may have an exterior width 406a and length 406b, with a gap of width 406c and length 406d. In order for capacitor 410 to match the surface area (and thus capacitance) of capacitor 110 active region 414c is expected to be larger than active region 114c. The embodiment of FIG. 4A represents a tradeoff versus the implementation of FIG. 1A. Here, the capacitor 410 is not formed in a native region, saving space as no non-active native region electrical isolation is present to take up space. However, this space savings is counteracted by the increased vertical extent of the capacitor 410 along the C/D axis, taking up additional space relative to its FIG. 1A counterpart 110.

FIG. 4B is a cross sectional view of bitcell 400 taken along line C to, according to one embodiment. Mask 416 is used during the fabrication process to prevent dopants from implanting into native region 432 of the FN tunneling device 430. Notably absent is a separate blockage in the mask 416 for the capacitor 410, as in this implementation, the capacitor 410 is instead formed in a P-well 418. Forming the capacitor 410 in a P-well region is advantageous, among other reasons, because the distance between the second 414b and third 414c active regions can be reduced relative to the distance between the second 114b and third 114a active regions of bitcell 100, thus saving considerable space in an NVM memory device. This difference in distance is not explicitly illustrated in FIGS. 1 and 4. In contrast, where the capacitor 110 is formed in a native region, the second 114b and 114c active regions are spaced a certain minimum distance apart (not labeled).

The placement of the native region varies during manufacturing due to mask misalignment and variation in resist opening size. A minimum native region enclosure of the capacitor has a large minimum size because the additional size ensures the minimum enclosure even under a worst case misalignment or opening size variation scenario. Similarly, the P-Well implant also has a minimum enclosure of the active region of the read device to ensure the device is correctly doped. If the P-Well resist wall is too close to the read device there can be well proximity effect implanted charge carriers.

Metal Lines and Metal Contact Sharing Between Bitcells

Figure 8A:
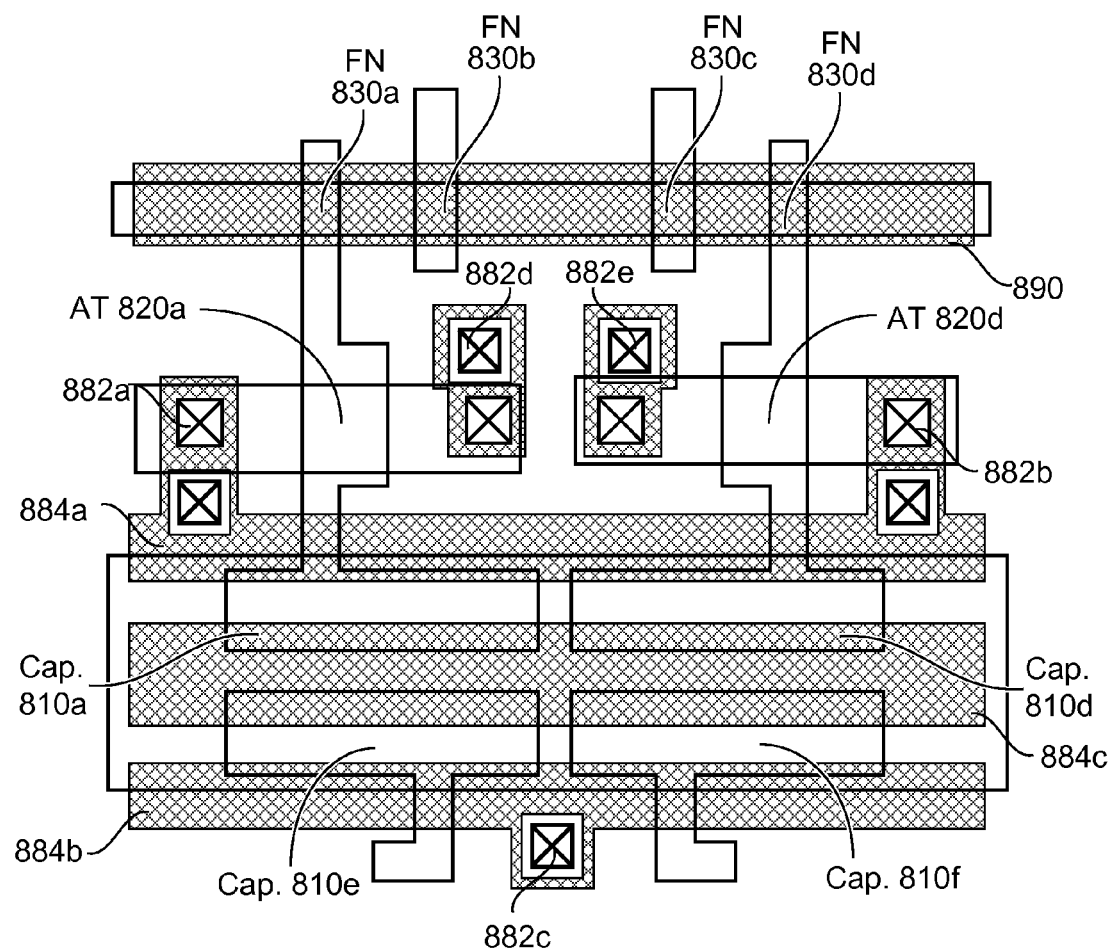
FIG. 8A is a top view of a first metal line and vertical interconnect accesses for the NVM bitcell according to one embodiment.
Figure 8B:
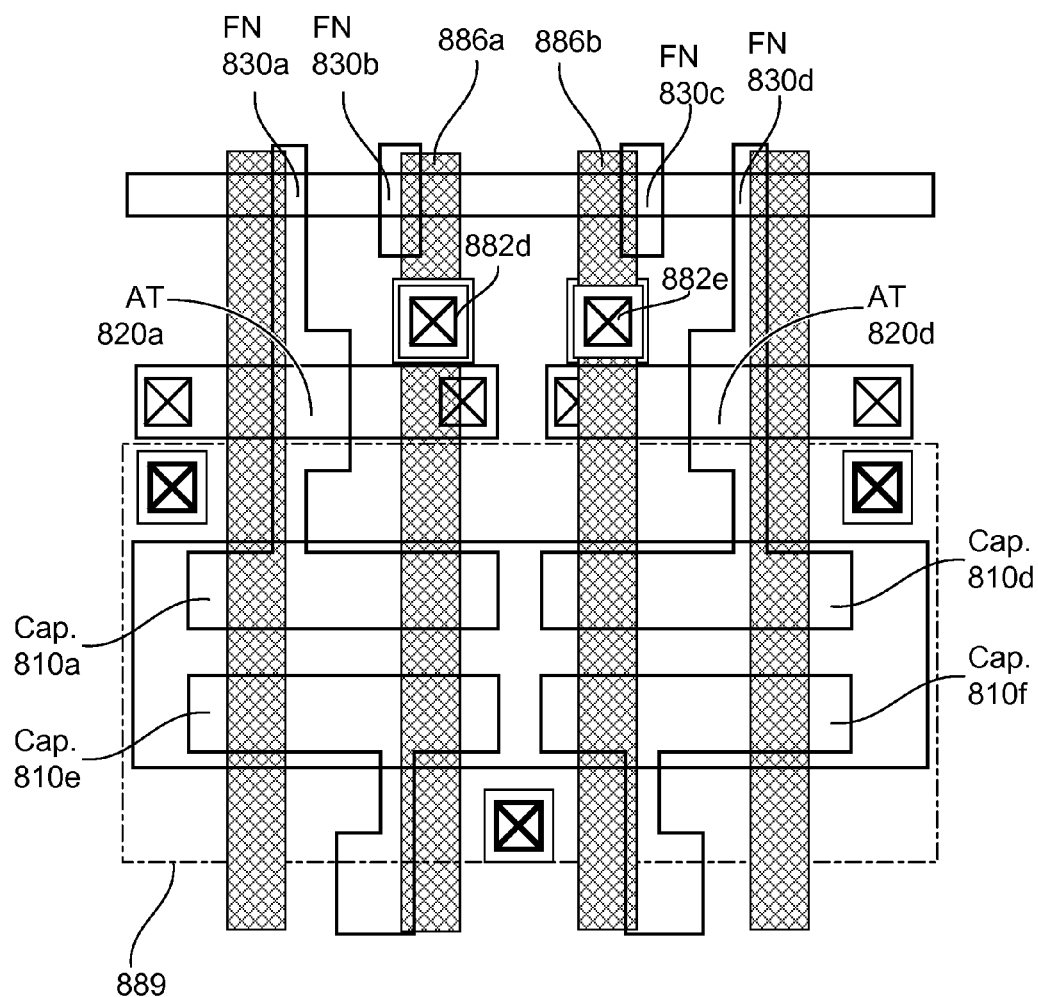
FIG. 8B is a top view of a second metal line and vertical interconnect accesses for the NVM bitcell according to one embodiment.

FIGS. 8A and 8B illustrate metal lines and metal contacts of an NVM memory device 800 that electrically couple the individual devices (e.g., the AT, capacitor, FN tunneling device) of NVM bitcells to power sources. The devices of example bitcells are shown for clarity in understanding how the various metal lines and metal contacts overlap. In both FIGS. 8A and 8B, two full bitcells are shown: a first bitcell having a capacitor 810a, AT 820a, and FN 830a, and a second bitcell having a capacitor 810d, AT 820d, and FN 830d. Portions of other bitcells in the NVM memory device are also shown, including FN tunneling devices 830b and 830c, each associated with different bitcells, and capacitors 810e and 810f, also each associated with different bitcells. The horizontal metal lines 884 and 890 and vertical metal lines 886 are shown only in part in FIGS. 8A and 8B. The partial bitcells and metal lines are illustrated for clarity to show how multiple bitcells can be arranged in an NVM memory device. It is presumed that in practice, an NVM memory device will include many full bitcells per row and column, and that the metal lines overlaying those bitcells will extend at least to the end of a column or row of bitcells.

As introduced above, each NVM bitcell has at least four electrical contacts: one for the source of the AT, one for the drain of the AT, one for the FN tunneling device, and one for the capacitor. In an NVM memory device, bitcells are arranged into rows and columns. A row and column arrangement allows for selection of individual bitcells for reading and writing. Erasure is performed on a row by row basis.

The sources of the multiple bitcells along a single row share a common power source, where each power source is coupled to the bitcells through a separate metal contact. In FIG. 8A, metal lines 884 are electrically coupled to individual sources using metal contacts 882. For example, along a single row, metal line 884a couples AT 820a and AT 820d with metal contacts 882a and 882b. Along different rows, layer 884b and 884c couple un-shown ATs with metal contact such as metal contact 882c.

The drains of the multiple bitcells along a single column share a common power source, where each drain is coupled to the power source through a separate metal contact. In FIG. 8A, metal contacts 882d and 882e couple AT 820a and AT 820d, respectively, to separate metal lines shown in FIG. 8B. FIG. 8B illustrates these metal lines 886, where metal line 886a is coupled to metal contact 882d, and where metal line 886b is coupled to metal contact 882e. The metal lines of FIGS. 8A and 8B are on different vertical planes. FIG. 8A represents a comparatively lower plane having the metal lines 884 and contacts 882, and FIG. 8B represents the vertical plane above the plane of FIG. 8A. The metal contacts 882d and 882e are coupled to the upper plane's metal lines 886a and 886b, respectively, using a through-silicon via such as a vertical electrical connection or vertical interconnect access (VIA) or another similar electrical coupling mechanism.

A third metal layer 889 electrically couples the sources of the ATs 820a and 820d through vias. This metal layer 889 increases the metal width so that the bitcell is capable of handling very high currents which may be applied, for example, when programming many bits in parallel.

The capacitors of the multiple bitcells along a single row share a common power source. For clarity, capacitor, FN tunneling device, and source rows are distinct from each other, such that any given row is associated with multiple bitcells but only one type of device from those bitcells (e.g., either capacitors, FN tunneling devices, or AT sources). However, in contrast to sources and drains, the capacitors of a row also share metal contacts. Thus, each capacitor of each bitcell of the row shares its metal contacts with the other capacitors of that row. More specifically, the third active regions of the bitcells of the row share metal contacts. This is feasible because the third active region itself is shared between the bitcells of the row. Thus, all bitcells of the row share one plate of the capacitor. As the other plate of the capacitor is the floating gate, the other plate is unique to each bitcell.

The metal contacts for the third active region of a row are not shown in FIGS. 8A and 8B because in the example embodiment of FIGS. 8A and 8B, they are located at one or both ends of the row of bitcells. If the metal contacts are located at both ends of the row, metal line 884c extends over the capacitors of the row, electrically coupling the metal contacts at both ends. There may be as few as a single metal contact for the capacitors of a row. However, more metal contacts may be used based on the layout of the NVM memory device. For example, two metal contacts may be used at either end of the row in order to ensure a consistent coupling, and additional metal contacts may be spaced between integer multiples (greater than one) of bitcells to further ensure consistent coupling.

The FN tunneling devices of the multiple bitcells along a single row share a common power source, and like capacitors, the FN tunneling devices also share metal contacts. Thus, each FN tunneling device of each bitcell of a row shares its metal contacts with the other FN tunneling devices of that row. More specifically, the first active regions of the bitcells of the row share metal contacts. This is feasible because the first active regions of the bitcell itself is shared between the bitcells of the row. No metal contact for the FN tunneling devices is shown in FIGS. 8A and 8B because the metal contacts are generally placed at one or both ends of a row, and thus are outside the scope of the drawing. The metal contacts may also be placed in between integer multiples (greater than on) of bitcells to ensure consistent electrical coupling between bitcells of a row. Metal line 890 couples the metal contacts of the row.

In implementations where the floating gate entirely covers the first active region, the doping of the first active region is configured such that there is a short underneath the floating gate for all operating voltages (e.g., during erasure and not during erasure). Consequently, all portions of the first active region (e.g., across all bitcells in a row) are at the same voltage. In implementations where the floating gate does not entirely cover the first active region there will be at least some uninterrupted path for current to flow to the FN tunneling devices of the row to ensure consistent electrical coupling.

NVM Bitcell Operation

The structure of bitcell 100 allows for a tight control over how the bitcell 100 is operated. The bitcell 100 uses FN tunneling on the FN tunneling device 130 to erase the floating gate, and uses channel hot electron injection (CHEI) or channel initiated secondary electron injection (CHISEL) on the AT 120 to program the floating gate. In a PMOS implementation, impact ionized hot election injection (IHEI) may instead be used to program the floating gate. The bitcell is read by activating the AT 120. The following description describes operation of a N-type bitcell 100 using CHISEL to program. However, the same principle applies equally to a N-type CHEI or P-type bitcell IHEI implementations.

One of many advantages to bitcell 100 is that because capacitor 110 is decoupled from both the source 102 and the drain 104, the capacitor 110 can be used to adjust the voltage on the floating gate 106 without affecting the voltages at the source 102 or the drain 104. Due to the capacitance between floating gate 106 and the third active region 114c, the floating gate 106 voltage will be a proportion of whatever voltage is applied at the third active region 114c. For example, if there is a 50% capacitive coupling between the floating gate 106 and the third active region 114c, then the floating gate 106 voltage will coupled by 50% of the voltage change applied to the third active region 114c (i.e., at the metal contact electrically coupled to the third active region 114c. The ability to bias the floating gate without affecting the source 102 voltage or the drain 104 improves the efficiency of read and CHISEL/CHEI/IHEI operations, and improves control over FN operations.

Table 1 set forth below illustrates read, write, and erase operation for an example N-type bitcell embodiment.

TABLE 1

Bitcell 100 Operation

| Operation | FN Tunneling Device | Drain | Source | Capacitor | Notes/ Transport Mechanism |
|---|---|---|---|---|---|
| Erase | 14 V | 0 V | 0 V | 0 V | Remove e– from floating gate |
| Program | Pre-charge 0 V | 2 V or 7 V | 7 V | 9 V | When drain is at 2 V, add e– to floating gate (CHISEL), when drain is at 7 V, no charge transfer |
| Read | 0 V | 1.8 V | 0 V | 3 V | |

To erase the floating gate 106, the first active region 114a is set to a high positive voltage (e.g., 14 V). This large positive voltage is sufficient to cause electrons (e–) to tunnel (via FN tunneling) from floating gate to the first active region 114a. During erasure, all other contacts are maintained at or near zero volts. FN tunneling is advantageous, among other reasons, because it requires significantly less current than other effects, such as band to band tunneling (BTBT). For a comparison, FN Tunneling typically requires approximate 1 nano-amp (nA) to erase a bit, while BTBT requires approximately 1 micro-amp (uA) to erase a bit for the same erase time. Consequently, 1000 times as many bits may be erased with FN Tunneling versus with BTBT where current capability is limited. As a result, in products with 512K bits or less all rows can be erased simultaneously with FN Tunneling. A whole-device single erase operation can be performed very quickly, significantly decreasing the time needed to erase the bitcell. Generally, it is advantageous that the bitcell can be erased rapidly. Rapid erasure is important during NVM memory device testing, as not all NVM memory devices will work correctly owing to the small scale of the NVM construction. Rapid erasure during testing allows a tester to more quickly verify if a given NVM memory device is operating correctly.

CHISEL and CHEI function similarly, with the exception that CHISEL uses secondary electrons instead of primary electrons. To program the floating gate 106 via CHISEL, the source 102 and drain 104 voltages are separately adjusted to create a voltage drop between the source 102 and the drain 104. The source is set to a high voltage, for example 7V, and the drain is set to a low voltage, for example 2V. The voltage drop establishes a high intensity electric field between the source 102 and the drain 104 across the channel region 108. The electric field causes electrons to accelerate from the source 102 towards the drain 104. Some of the secondary electrons will have enough energy to be injected onto the floating gate 106. For those bitcells on a row that are not being programmed, the drains of those are instead held at a similar voltage as the source (e.g., 7 V, or reasonably close thereto). In contrast to the bitcells being programmed, no high intensity electric field is generated between the sources and drains of these bitcells, and thus electrons generally do not achieve the energy needed to be injected onto the floating gate.

During programming, the floating gate is coupled to a high voltage. The higher the voltage, the stronger the induced vertical electric field, and consequently the more efficiently charge carriers are injected. Concurrently, the first active region 114a is held at a moderate voltage, for example 5V. Typically, the first active region 114a is electrically coupled between a number of rows. By grouping rows together, more bits can be erased in a single operation. This also reduces the number of tunnel junction row logic switches that are needed to couple together independent rows or sets of rows. As a result, this reduces both the erase time per bit as well as the size of the control logic devices controlling the bitcells. Because rows are shared, the tunnel junctions joining rows are incapable of being raised to so high a voltage that FN tunneling occurs on unselected rows. Further, the third active region 114c is held at a high voltage, for example 9V. The voltage on the third active region 114c is limited by the occurrence of diode breakdown at the diode-like junction between the N+ implant 160 and P-Sub 132a regions. 9V is a typical voltage for the bitcell shown in FIG. 4A where the diode breakdown point at the diode-like junction between the N+ implant 102 and P-Well 118 regions is ~9V. In bitcells where the third active region 114c is in a native region, such as FIG. 1A, that capacitor can be brought higher than 9V without diode breakdown behavior occurring.

Through capacitive coupling, this raises the voltage on the floating gate 106, for example, if there is 50% capacitive coupling, this raises the floating gate 106 voltage to 4.5 V. By independently raising the floating gate voltage through capacitive coupling with the capacitor, CHISEL (and CHEI) efficiency is increased. Maintaining high CHISEL efficiency decreases the amount of current needed by the bitcell to perform CHISEL and therefore to program the floating gate 106. Decreasing the amount current needed to perform program operations means that CHISEL can reduce the size of a charge pump that produces currents high enough to perform CHISEL. Further, in some embodiments, a charge pump may be used only to drive the capacitor of the bitcell (e.g., rather than the capacitor and the AT transistor). This reduces the amount of current needed to program the bitcell, thereby allowing for the use of a comparatively smaller charge pump (e.g., relative to the size of a charge pump needed in the capacitor and transistor example).

To read the voltage on floating gate 106, the capacitor 114c is brought to voltage sufficient to couple the floating gate of erased bits (e.g., bits having a sufficiently positive charge) up significantly above the AT's $V_T$, which in one embodiment is in the 3V-5V range. For selected rows, a drain to source $V_{ds}$ is set so that erased bits produce enough current for sense amplifiers coupled to the AT 120 to read the logical state of the floating gate (or data state) in a specified amount of time. In one embodiment the drain 104 is set to a low voltage such as 0V and the source is set to a higher voltage such as 1.8V. In another embodiment the drain is set to 1.8V and the source is set to 0V. Due to the erased bits having a significantly higher (e.g., more positive) voltage than the programmed gates, peripheral circuitry should be able to distinguish the erase bits from the program bits, correctly reading a 0 or 1 data state. For unselected rows, capacitor 110 is held at ground, and as a result the AT 120 is off (that is, below the $V_T$) for both erased and programmed bits.

For example, assume the bitcell 100 has a threshold voltage $V_T$ of 0.5 V, where the threshold voltage $V_T$ is the voltage on the floating gate 106 where the AT 120 is turned on, causing current to flow between the source and the drain in channel 108 (assuming a sufficient differential in voltage between source and drain, such as the example 1.8V difference above). A logical state of 0 may be represented by a floating gate 106 voltage of 0 V (assuming the source 102, drain 104, and capacitor 110 are set to 0 V bias). In contrast, a logical state of 1 may be represented by a floating gate 106 voltage of −1 V.

In this example, when a read operation is performed, the source 102 and capacitor 1110 are increased to positive voltages such as 1.8 V and 3 V, respectively. If the bitcell 100 has a logical state of 0, due to capacitive coupling the voltage on the floating gate 106 will be raised from 0V to 1V, exceeding the threshold voltage $V_T$ of 0.5 V. Consequently, the AT 120 turns on and current flows through channel 108 from the source 102 to the drain 104. In contrast, if the bitcell has a logical state of 1, despite capacitive coupling the voltage on the floating gate 106 will only be 0V after being raised from −1V, not exceeding the threshold voltage $V_T$ of 0.5V. Consequently, the AT 120 does not turn on, and current does not flow through the channel 108 from the source 102 to the drain 104.

Bitcell 100 may also make use of adaptive read schemes which adjust the voltage on the capacitor 110 to compensate for process-voltage-temperature (PVT) variations. PVT variations can affect the amount current provided during read. Repeated cycling (programming and erasing) can result in charge trapping at the interface between the channel 108 and the gate oxide 150. Charge trapping can cause a shift in the threshold voltage $V_T$ of a bitcell, thereby affecting the performance of the bitcell. Adaptive read schemes may be used to compensate for erroneous bitcell performance due to PVT or charge trapping. In one embodiment, an adaptive read scheme is implemented by using a reference bitcell programmed to a logical state of 1 to set bias conditions such that a known read current is provided. The read current of the reference bitcell may be used to adjust the various voltages used to read the bitcell. The reference bitcell should behave the same as the bitcell under various PVT conditions. The adaptive read scheme may then adjust the capacitor 110 voltage to compensate for any changes in the threshold voltage of the bitcell due to PVT variations. In one embodiment, reference bitcells are cycled with respect to row in a bitcell array to better mimic charge trapping behavior and therefore better control the adaptive read scheme.

Effect of Photo Resist Scaling on Diode Breakdown Behavior

As described above with reference to FIGS. 1A and 1D, in some implementations the FN tunneling device (e.g., FN tunneling device 130) is formed in a native region that is un-doped by additional implants following receipt of the wafer (or substrate) from the original manufacturer. During the manufacture of the NVM bitcell, dopant implantation is controlled using masks that define where the dopants are not permitted to penetrate into the substrate. Masks may include photo resist blocks that are temporarily positioned between the dopant source and the substrate to prevent implantation of dopants in particular regions of the substrate. Masks may also include portions of the NVM bitcell, for example the oxide 150 and spacers 158 of the bitcell 150 acts as a mask that prevents dopants from penetrating under portions of the floating gate.

The implantation methods used to implant dopants into the substrate often cause dopants to penetrate in regions of the substrate that have been blocked off by masks. This behavior is expected and in fact intended in many instances, for example implants 152, 156, 160, and 162 are designed to implant dopants beyond the regions of the substrate defined by a mask. These implant processes can cause problems where a native region of the bitcell is desired for functionality.

Figure 5A:
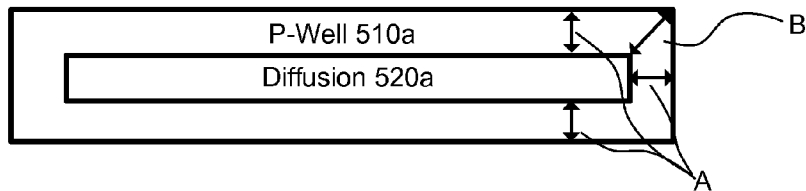
FIG. 5A illustrates a planned photo resist for forming a P-well in a substrate.
Figure 5B:
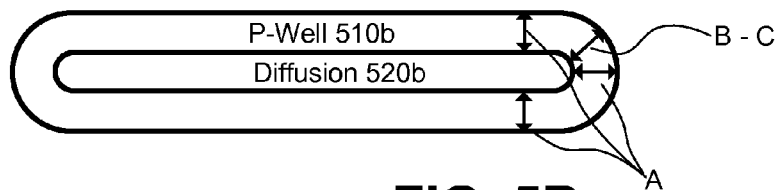
FIG. 5B illustrates a resulting, in process photo resist for forming a P-well in a substrate.

One example where implant processes can cause problems with a native well is exhibited in FIGS. 5A and 5B. The standard CMOS logic process includes a diffusion or active step. This step determines what portions of the substrate are formed into STI regions and active/diffusion regions. Due to the relative importance of this step, generally thin, high quality photoresists 520a are used in conjunction with "hard masks" (typically a nitride layer) to define a portion of the substrate where STI is not formed. Due to the thickness of the photoresist, the quality of the photoresist, and nature of the process, the "rounding" of the masked areas is minimal. Rounding is a difference between a region is defined on a mask and how it ends up in the photoresist's shape on the wafer. Rather than being manufactured exactly as defined by the mask, rounding occurs at nonlinear boundaries of the defined region, due to the manner in which light interacts with the photoresist during the exposure. The term "rounding" refers to the tendency of sharp transitions in direction in a photoresist to round out in practice.

The standard CMOS logic process also includes a P-well photo resist step for forming a P-well such as P-well 118. The P-well photoresist step uses a very thick photo resist 510a. The thick photo resist is needed to block the deep well implants. The thick photo resist forces the photo process to use a lot of light, high exposure dose, to expose the full thickness of the photo resist. As the exposure dose increases the rounding of corners increases. FIGS. 5A and 5B illustrate the difference in rounding between the two types of photoresists 510a and 520a, where FIG. 5A illustrates a photoresist as planned, and FIG. 5B illustrates the resulting actual photo resists 510b and 520b in process. In FIG. 5B the enclosure the diffusion 520b by the P-Well photo resist 510b is smaller in region B-C than it is in region A.

Figure 6A:
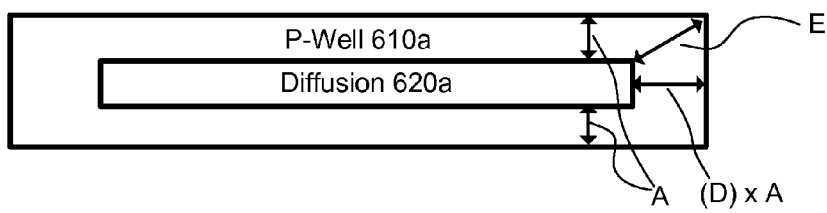
FIG. 6A illustrates a planned photo resist for forming a P-well in a substrate according to one embodiment.
Figure 6B:
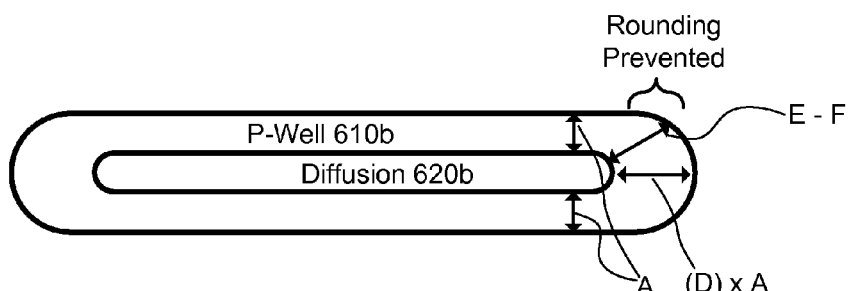
FIG. 6B illustrates a resulting, in process photo resist for forming a P-well in a substrate according to one embodiment.

Rounding during dopant implantation causes unwanted dopants to be implanted into regions (such as a native region) that are not intended to have additional dopants. FIGS. 6A and 6B illustrate an example planned 610a, 620a and actual photoresists 610b, 620b for use in generating the bitcell 100 in one embodiment. The size of the photo resist 610a is configured to account for rounding that is expected to occur by increasing the size of the photo resist along one axis relative to another axis. In FIG. 6A, the P-well 610a and diffusion 620a photoresists are illustrated as having a rectangular shape for example purposes only. In practice other shapes may be used and the illustrated example is intended to highlight a difference in length along one of two coordinate axes.

In FIG. 6A, along a vertical axis the photo resist 610a is longer than the diffusion 620a by a distance A, which is the same as length difference A from FIG. 5a. Along a horizontal axis, however, rather than being the same width A as the photo resist 510a, the width of the photo resist 610a is a scalar multiple times greater than the width (e.g., a scalar D times A). More generally, the photo resist 610a extends further out from the diffusion 620a along one axis relative to another axis. FIG. 6B illustrates how the photo resist 610b will perform in practice with respect to rounding and implantation of dopants. In contrast to the rounding B minus C resulting from photo resist 510b, photo resist 610b instead results in rounding E minus F. The distance E minus F is larger than the distance B minus C.

Preventing implantation into the native region using the photo resists illustrated in FIGS. 6A and 6B improves diode breakdown behavior in the resulting device by delaying diode breakdown behavior to higher voltages. As above, this provides more dynamic range for applying high voltages in order to induce effects such as FN tunneling. In the NVM bitcell (e.g., NVM bitcell 100), diode breakdown behavior occurs first (e.g., at the lowest applied voltages) along the shortest distance between the doped region and the native region. In the example of FIG. 5B, this shortest distance is distance B-C. However, if bitcell 100 is constructed using the masks 610a and 610b, diode breakdown behavior instead occurs through distance A, as due to the extension D times A, distance E minus F is greater than distance A. Thus, extending the P-well 610b photo resist by factor D delays diode breakdown behavior to higher voltages because the shortest distance for diode breakdown behavior to occur through is distance A, rather than the shorter distance B minus C.

Figure 7A:
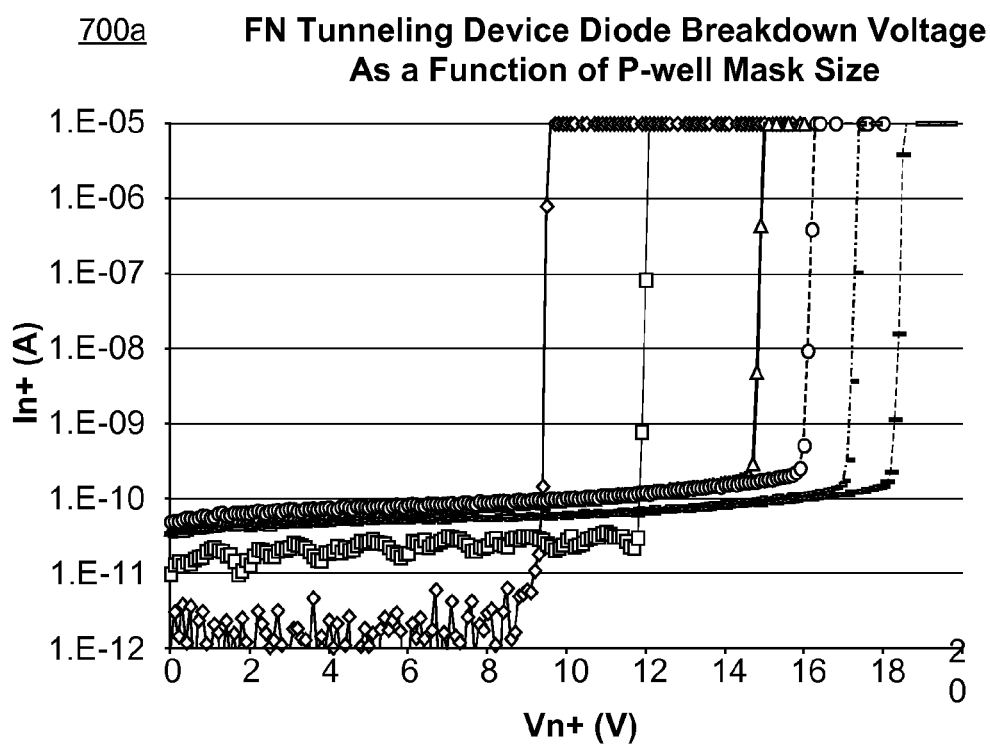
FIG. 7A is a graph plotting diode breakdown voltages of a FN tunneling device formed using several different P-well masks, according to one embodiment.
Figure 7A:
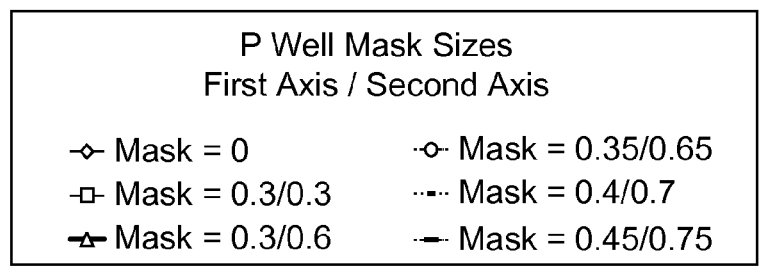

FIG. 7A is a graph plotting diode breakdown voltages of a FN tunneling device formed using several different P-well layout options, according to one embodiment. Mask=0 indicates no native exists. For lines with two number, the first number indicates extension in the vertical direction, whereas the second number indicates extension in the horizontal direction. For example, Mask=0.3/0.3 is an example case where both directions have been extended the same amount, whereas mask=0.45/0.75 is an example case where the vertical direction has only been extended by a factor of 0.45 relative to the horizontal direction's expansion of 0.75.

Generally, these plots illustrate that extension of the P-well mask in both directions generally improve (e.g., delay) diode breakdown behavior to higher voltages. Further, these plots illustrate that extension of the P-well mask along one axis but not another also improves diode breakdown behavior. Given that bitcell space is constrained and it is desirable to reduce the space taken up by the bitcell 100 wherever possible, embodiments where the P-well mask is extended along one axis but not another provide an attractive tradeoff for improved diode breakdown behavior that linearly scales with bitcell surface area increases. This is better than extending along both axes simultaneously, which improves diode breakdown behavior at the cost of $N^2$ scaling of bitcell surface area. Regardless, both options provide a viable mechanism for improving diode breakdown behavior to manufacture a functional NVM bitcell.

Effect of Capacitor Length C on Bitcell Behavior

Another characteristics of the NVM bitcell that may vary between implementations is the channel length C of the capacitor 110. Graphs of FIGS. 7B-7C illustrate how varying this feature affects the performance of the bitcell.

Figure 7B:
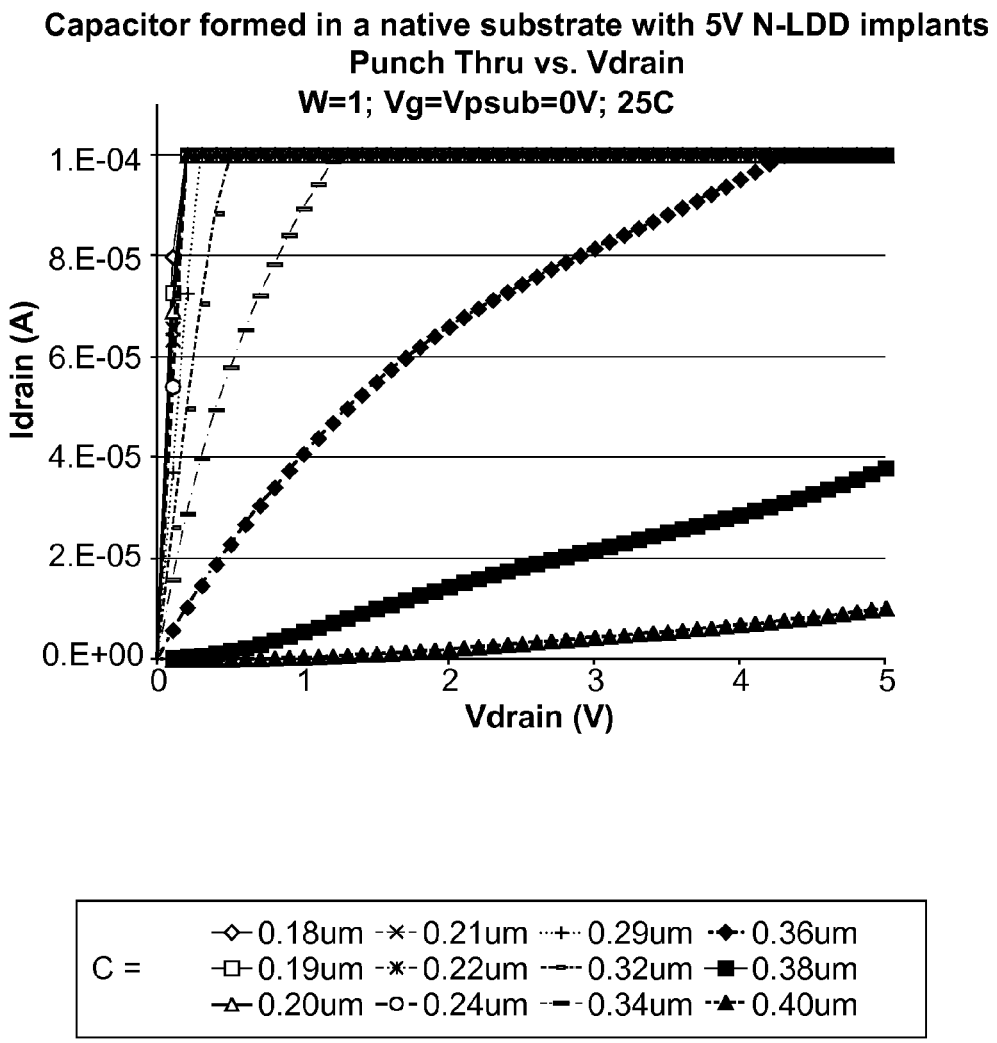
FIG. 7B is a graph plotting punch through voltages as a function of drain voltage for various channel lengths of a bitcell capacitor, according to one embodiment.
Figure 7C:
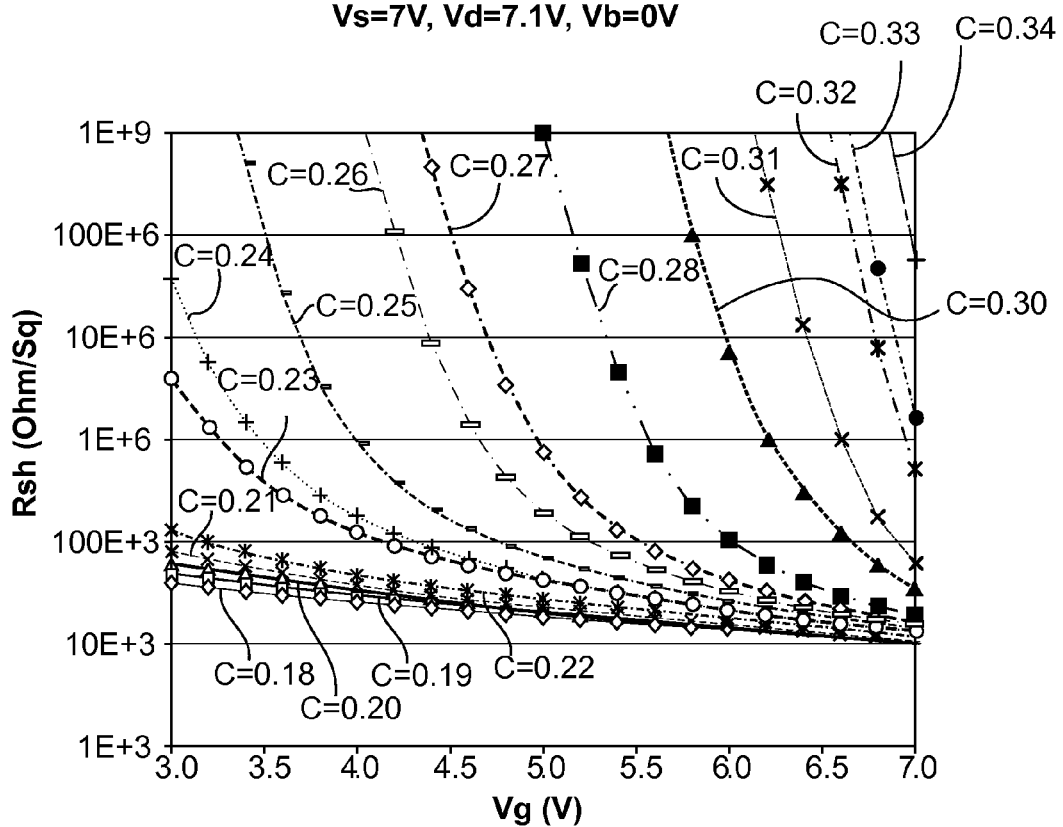
FIG. 7C is a graph plotting sheet resistance as a function of gate voltage for various channel lengths of a bitcell capacitor in a P-well doped substrate, according to one embodiment.

FIG. 7B is a graph plotting punch through voltages as a function of drain voltage for various channel lengths of a bitcell capacitor, according to one embodiment. For purposes of this test, two portions of the capacitor 110 are configured to be attached to separate source and drain electrical contacts. As the drain voltage is varied, the floating gate, source, and native region are held at zero volts. The operating temperature was maintained at approximately 25° Celsius (C). Punch through occurs where the capacitor has a drain voltage that induces significant drain-source current even though the "transistor" formed (e.g., in channel C under the floating gate 106) is biased in its off state. Shorter lengths C have punch through occur even at very low drain voltages due to the short caused by the 5V dopings penetrating underneath the floating gate. This punch through behavior is desirable, as it indicates that capacitive coupling between the third active region 114c and the floating gate 106 will be maintained even under high applied voltages. As length C increases, punch through is more difficult to induce. This correlates with conditions being less favorable for maintaining capacitive coupling due to the emergence of a depletion region from the third active region 114c under higher applied voltages.

Punch through behavior is also relevant to the FN tunneling device 130. Normally, when manufacturing using a 0.18 µm CMOS logic process, the smallest channel length L or C that can be constructed for a 5V doping is 0.6 µm, due to the expected doping overlap. However, the FN tunneling device 130 can be manufactured beneath this 0.6 µm minimum down to 0.18 µm (the minimum L for a 1.8V device with appropriate well and LDD implants). Specifically, any aspect of bitcell 100 can be manufactured down to a channel length (e.g., L or C) of 0.18 µm L. While such a narrow gate is not necessary for a capacitor 110, the result of creating a FN tunneling device 130 with a channel length L this short is that the 5V doping will penetrate underneath the floating gate 106 and overlap with itself, thereby shorting the first active region. The greater the overlap, the higher the voltage on the first active region 114a can be increased without destroying the short created by the doping (or, the greater "dynamic range" of voltage that can be applied without destroying the short). Having a greater dynamic range provides a larger voltage range to use for causing FN tunneling or for capacitive coupling, for example for use in the FN tunneling device 130 and capacitor 110, respectively.

Bitcells 100 with lengths L and C longer than 0.4 μm are still functional, however. Generally, shorter lengths channels are preferable, as shorter channels correspond to better intersection/overlap in dopings, resulting in a device in which FN tunneling and capacitive coupling is more easily performed at lower voltages. As channel length increases, doping intersection/overlap is reduced, the doping-induced short is less robust and consequently making these effects more difficult to perform.

FIG. 7C is a graph plotting sheet resistance $R_{sh}$ as a function of gate voltage for various channel lengths C of a bitcell capacitor in a P-well doped substrate, according to one embodiment. FIG. 7C is for a 5V NMOS device in P-Well. FIG. 7C shows that a channel length C of 0.21 um is desirable. The C=0.21 would be used in the bitcell shown in FIG. 4C. For all plots, as the floating gate voltage is varied, the source voltage is held at 7 V, the drain voltage is held at 7.1V, and the P-well is held at 0 V (referred to as $V_b$ for bulk, where the bulk is the P-well. For all channel lengths C, as gate voltage decreases sheet resistance $R_{sh}$ in the substrate of the test transistor increases. Depending on length C, at some voltage the sheet resistance $R_{sh}$ increases significantly due to the test transistor being constructed in P-well. The significant increase in sheet resistance is due to the depletion region in the P-well rising to the surface of the substrate, interfering with the channel on the surface of the substrate between source and drain in the test transistor. Generally, the shorter the length C, the lower gate voltage at which the sheet resistance rapidly. This is a result of better overlap in the dopings across shorter length C channels.

Figure 7D:
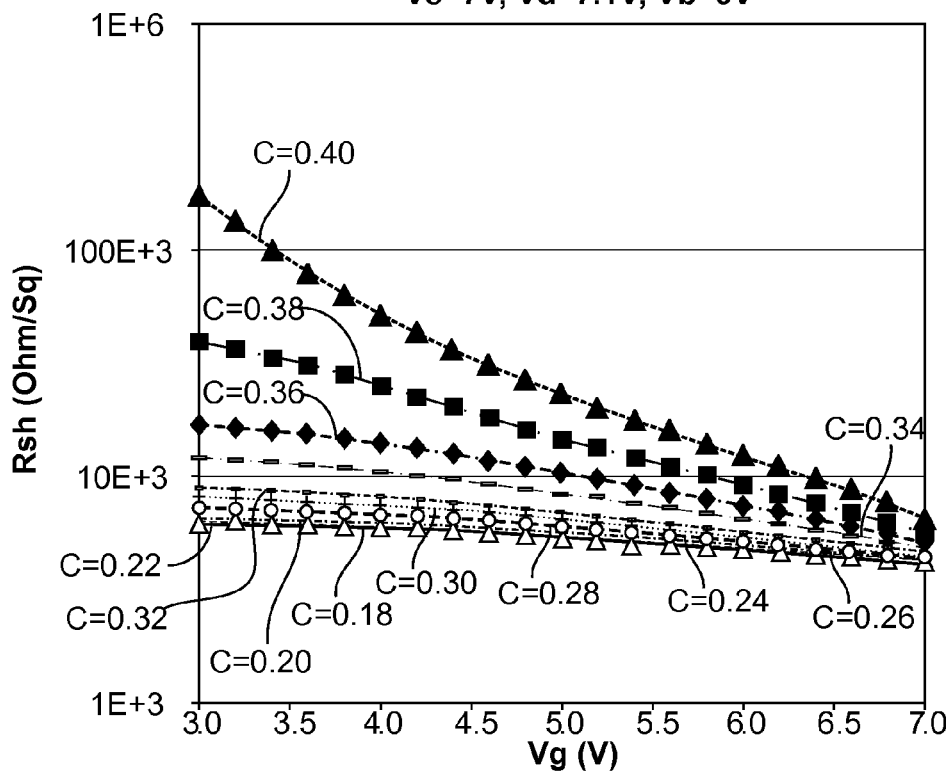
FIG. 7D is a graph plotting sheet resistance as a function of gate voltage for various channel lengths of a bitcell capacitor in a native substrate, according to one embodiment.

FIG. 7D similarly plots sheet resistance as a function of gate voltage, however in contrast to the P-well capacitor of FIG. 7C, the capacitor of FIG. 7D is formed in a native region instead. As with FIG. 7C, smaller gates voltages sill result in higher sheet resistances $R_{sh}$, However for the capacitor formed in a native region sheet resistances never increase dramatically as they do in the P-well capacitor. This is due to the lack of counter-doped charge carriers (e.g., holes) in the native region, thus it is more difficult for the depletion region to rise to the surface of the substrate to interfere with the channel between the source and drain of the capacitor. FIGS. 7C and 7D illustrate a similar point as FIG. 7B, generally that shorter channels C offer better capacitive coupling, both with respect to sheet resistance $R_{sh}$ as well as with respect to punch through.

FIGS. 7C and 7D also illustrate the tradeoffs between forming the capacitor 110 in a P-well versus a native region. In a P-well implementation, to counteract the sheet resistance of a P-well capacitor while maintaining similar capacitive coupling, the capacitor is configured to ensure that comparatively more dopants are present underneath the floating gate 106. This generally involves constructing a narrower floating gate 106 (e.g., with smaller channel length C) with increased perimeter distance, providing more edges for the dopants to be planted under. These additional dopants counteract the counter-dopants of the P-well, forestalling increased sheet resistance and offering better capacitive coupling at lower applied voltages. An example of this implementation is illustrated in FIGS. 4A and 4B.

However, increasing the capacitor's perimeter generally takes additional substrate surface area, thus decreasing bitcell density. In contrast, forming the bitcell in a native region saves on the space needed to form the capacitor. Despite this savings gain, however, forming the capacitor in a native region costs space in terms of the separation between the second 114b and third 114c active region used to ensure that P-well dopants for the second active region 114b do not implant into the third active region 114c. Although mask 116b blocks most of these dopants, the well proximity effect can cause some dopants to implant regardless of the mask 116b. Additional space between the second 114b and third 114c active regions can prevent this form of implantation into the third active region 114c at the cost of increased distance between the two regions, and therefore increased bitcell size. Consequently, space savings in one area using one implementation result in space costs in another implementation. Both approaches are viable, they simply trade off different requirements. A third approach is to add additional process steps. For example and shallow N-Well can the added to the process. In some processes, a shallow N-Well may be used to make high density SRAM cells. If a shallow N-Well is part of the process, it can be used in the NVM bitcell to reinforce the desired behavior of the devices of the bitcell. Some processes have $V_T$ adjust photo/implants steps. Any $V_T$ adjust implant of the appropriate polarity can be used to reinforce the short under the FN tunneling device or capacitor.

Alternative Embodiments

Although the various embodiments of the NVM bitcell 100 have been described with respect to a 5V CMOS logic process, in other embodiments the NVM bitcell 100 may also be constructed according to a 3.3V, 2.5 V, or a 1.8V CMOS logic process. The channel length L of the short in the FN tunneling device, the dopants, and other specifications of the NVM bitcell are expected to vary in these other CMOS logic processes, however the functionality and features of the bitcell remain the same across implementations.

In addition to being constructed using different CMOS logic processes, the NVM bitcell may be constructed with different implants for the AT. Table 2 sets forth several examples for combinations of implants that can be used to create functional ATs of the NVM bitcells according to various embodiments.

TABLE 2

Implant Combinations

| Implant | VT of AT | e− Injection | h+ injection | Notes |
| --- | --- | --- | --- | --- |
| 5 V N-LDD (e.g., implant 160 in FIG. 1B) | Standard | Low | Low | Implant designed to handle 5 V operation without Hot Carrier Injection (HCI) or Gate Induced Drain Leakage (GIDL). Junction is graded |
| 1.8 V N-LDD and P-Halo | High | High | High | Implant configured to reduce series resistance and reduce GIDL at 1.8 V. At higher voltages, GIDL and CHEI will |

TABLE 2-continued

Implant Combinations

| Implant | VT of AT | e− Injection | h+ injection | Notes |
|---|---|---|---|---|
| (e.g., implants 152 and 156 in FIG. 1B) | | | | occur in significant amounts |
| 1.8 V N-LDD, P-halo, and 5 V P-LDD (e.g., implants 252, 254, and 265 in FIG. 2) | Very High | Very High | Very High | Increases doping in halo region. Increases $V_T$, GIDL, and CHEI |
| 1.8 V N-LDD, P-halo, and 5 V N-LDD {Q: Not illustrated anywhere} | Standard | Low | Low | 5 V N-LDD extends past the 1.8 V N-LDD and P-Halo. Consequently, a device with these implants functions similarly to the 5 V N-LDD implant case described in the first row of the table. |
| No LDD | Variable | High | High | The VT will changing depending upon whether N+ source/drain implants (e.g., 102/104) extend under the floating gate. If they do, the device will behave similarly to the 5 V N-LDD case described in the first row of the table. If they do not, the $V_T$ will be very high. |

Overview of Electronic Design Automation Design Flow

Figure 9:
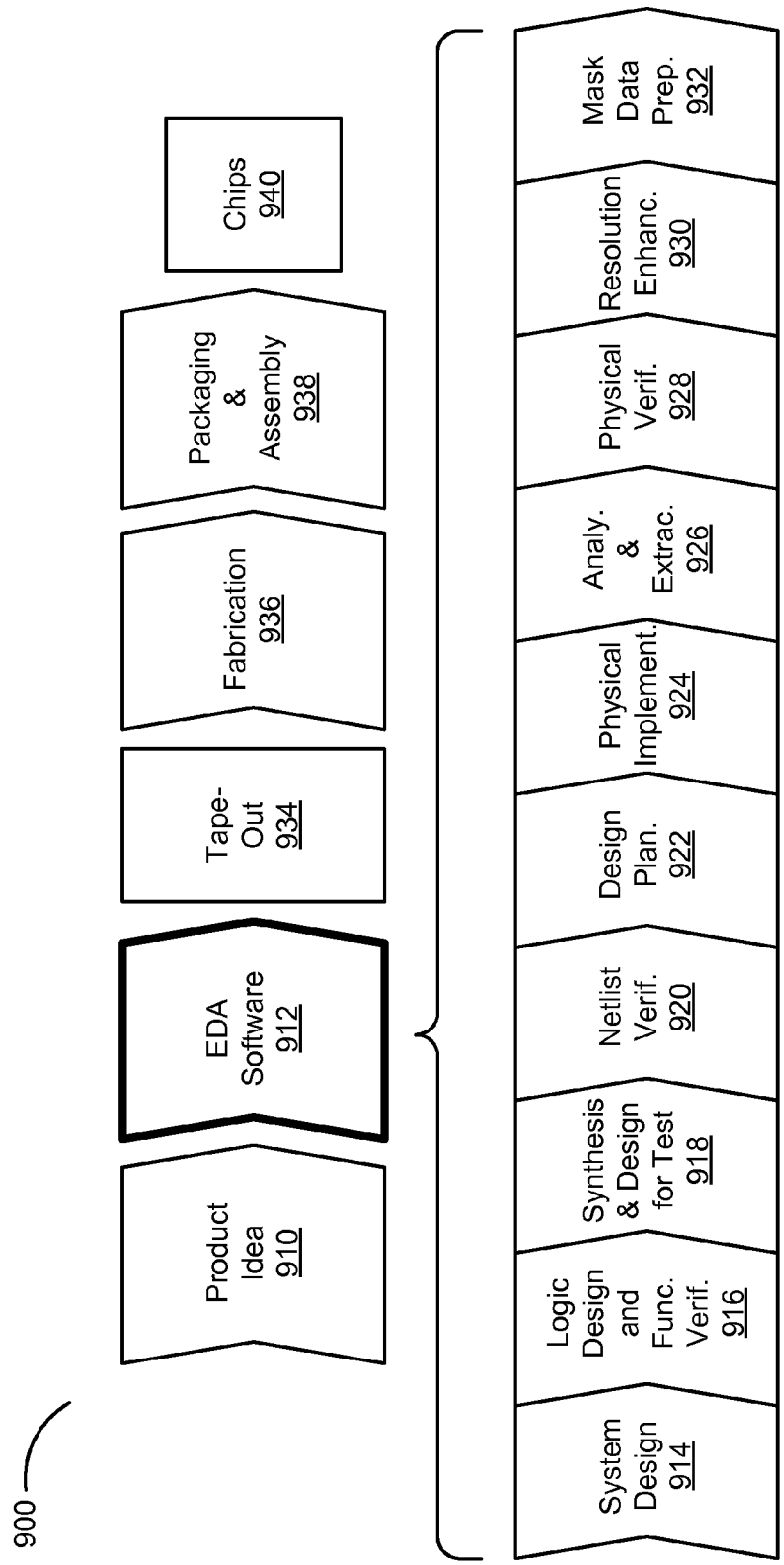
FIG. 9 is a flowchart illustrating the various operations in the design and fabrication of an integrated circuit such including the NVM bitcell, according to one embodiment.

FIG. 9 is a flowchart illustrating the various operations in the design and fabrication of an integrated circuit such including the NVM bitcell, according to one embodiment. This process starts with the generation of a product idea 910, which is realized during a design process that uses electronic design automation (EDA) software 912. When the design is finalized, it can be taped-out 934. After tape-out, a semiconductor die is fabricated 936 to form the various objects (e.g., a bitcell including gates, metal lines, vias) in the integrated circuit design. Packaging and assembly processes 938 are performed, which result in finished chips 940.

The EDA software 912 may be implemented in one or more computing devices including a memory. An example of a memory is a non-transitory computer readable storage medium. For example, the EDA software 912 is stored as instructions in the computer-readable storage medium which are executed by a processor for performing operations 914-932 of the design flow, which are described below. This design flow description is for illustration purposes. In particular, this description is not meant to limit the present disclosure. For example, an actual integrated circuit design may require a designer to perform the design operations in a difference sequence than the sequence described herein.

A cell library incorporating one or more NVM bitcells or circuits as described above may be stored in the memory. The cell library may be referenced by the EDA software 912 to create a circuit or electronic device incorporating the NVM bitcells or circuits.

During system design 914, designers describe the functionality to implement. They can also perform what-if planning to refine the functionality and to check costs. Note that hardware-software architecture partitioning can occur at this stage. During logic design and functional verification 916, VHDL or Verilog code for modules in the circuit is written and the design is checked for functional accuracy. More specifically, the design is checked to ensure that it produces the correct outputs. During synthesis and design for test 918, VHDL/Verilog is translated to a netlist. This netlist can be optimized for the target technology. Additionally, tests can be designed and implemented to check the finished chips. During netlist verification 920, the netlist is checked for compliance with timing constraints and for correspondence with the VHDL/Verilog source code.

During design planning 922, an overall floor plan for the chip is constructed and analyzed for timing and top-level routing. Example EDA software products from Synopsys, Inc. of Mountain View, Calif. that can be used at this stage include: Astro® and IC Compiler® products. During physical implementation 924, the placement (positioning of circuit elements) and routing (connection of the same) occurs. During analysis and extraction 926, the circuit function is verified at a transistor level, which permits refinement. During physical verification 928, the design is checked to ensure correctness for: manufacturing, electrical issues, lithographic issues, and circuitry. During resolution enhancement 930, geometric manipulations of the layout are performed to improve manufacturability of the design. During mask-data preparation 932, the 'tape-out' data for production of masks to produce finished chips is provided.

Embodiments of the present disclosure can be used during one or more of the above-described stages. Specifically, in some embodiments the present disclosure can be used in EDA software 912 that includes operations between design planning 922 and physical implementation 224.

Additional Considerations

Upon reading this disclosure, a reader will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A non-volatile memory bitcell comprising:
a tunneling device comprising
a first portion of a floating gate above a first active region of a substrate,
a portion of the first active region beneath the first portion of the floating gate, the first active region being a native region comprising a lightly doped drain (LDD) implant overlapping in the portion of the first active region beneath the first portion of the floating gate, and
a first insulation layer between the portion of the first active region and the first portion of the floating gate,
the tunneling device configured to cause charge carriers to transition between the first active region and the first portion of the floating gate responsive to a voltage being applied to the first active region;
a transistor comprising a source, a drain, and a second portion of the floating gate above a second active region of the substrate, the source and drain formed in the second active region,
wherein the source and the drain each comprise a first implant of a first polarity,
wherein the source comprises a second implant of a second polarity opposite the first polarity, and
wherein the drain does not include an implant of the second polarity;
a capacitor comprising a first plate, a second plate, and a second insulation layer between the first and second plates, the first plate comprising a third portion of the floating gate above a third active region of the substrate, and the second plate comprising a portion of the third active region underneath the third portion of the floating gate.

2. The non-volatile memory bitcell of claim 1, wherein the tunneling device is a Fowler Nordheim (FN) tunneling device.

3. The non-volatile memory bitcell of claim 1, wherein electrons are transferred from the second active region to the second portion of the floating gate to program the bitcell responsive to applying a first set of voltages to the source of the transistor, the drain of the transistor, and the third active region.

4. The non-volatile memory bitcell of claim 3, wherein an amount of charge on the floating gate is read out responsive to applying a second set of voltages to the source of the transistor, the drain of the transistor, and the third active region.

5. The non-volatile memory bitcell of claim 1, wherein the first active region, the second active region, and the third active region are electrically isolated from each other.

6. The non-volatile memory bitcell of claim 5, wherein the first active region, the second active region, and the third active region are separated using shallow trench isolations.

7. The non-volatile memory bitcell of claim 1, wherein the first active region is a native region undoped from an original wafer prior to the deposition of the floating gate.

8. The non-volatile memory bitcell of claim 1, wherein the first active region comprises a charge carrier implant extending underneath the first portion of the floating gate.

9. The non-volatile memory bitcell of claim 1, wherein a width of the first portion of the floating gate over first active region is between 0.04 and 0.2 microns.

10. The non-volatile memory bitcell of claim 1, wherein the tunneling device is configured to prevent diode breakdown behavior in the first active region when the first active region is raised to 10 volts.

11. The non-volatile memory bitcell of claim 1, wherein the second active region comprises a well implant of charge carriers.

12. The non-volatile memory bitcell of claim 1, wherein the second implant of the source comprises a P-type halo implant and the first implant of the source comprises either a N-type lightly doped drain (LDD) implant or a source-drain (S/D) extension implant.

13. The non-volatile memory bitcell of claim 12, wherein the second implant of the source further comprises a P-type LDD implant.

14. The non-volatile memory bitcell of claim 1, wherein the first implant of the drain comprises a N-type LDD implant.

15. The non-volatile memory bitcell of claim 1, wherein the third active region is a native region undoped from an original wafer.

16. The non-volatile memory bitcell of claim 1, wherein the portion of floating gate above the third active region is rectangular.

17. The non-volatile memory bitcell of claim 1, wherein the third active region comprises a well implant of charge carriers.

18. The non-volatile memory bitcell of claim 1, wherein the portion of floating gate above the third active region is ring shaped.

19. The non-volatile memory bitcell of claim 1, wherein implant charge carriers extend underneath an entirety of the third portion of the floating gate.

20. The non-volatile memory bitcell of claim 1, wherein the third active region comprises a 5 volt N-type LDD implant.

21. The non-volatile memory bitcell of claim 1, wherein the first, second, and third portions of the floating gate are electrically coupled together.

22. The non-volatile memory bitcell of claim 1, wherein the third active region is shared with a plurality of other bitcells, and wherein the other bitcells share a metal contact.

23. The non-volatile memory bitcell of claim 1, wherein the first active region is shared with a plurality of other bitcells, and wherein the other bitcells share a metal contact.

24. The non-volatile memory bitcell of claim 1, wherein the bitcell is fabricated using a standard complementary metal oxide semiconductor (CMOS) logic process.

25. The non-volatile memory bitcell of claim 1, wherein the first active region is formed in a region of substrate with a dopant concentration of less than $10^{16}$ atoms/cm$^3$.

26. The non-volatile memory bitcell of claim 1, wherein the third active region is formed in a region of substrate with a dopant concentration of less than $10^{16}$ atoms/cm$^3$.

27. The non-volatile memory bitcell of claim 1, wherein the first active region is shared with another tunneling device of another bitcell.

28. The non-volatile memory bitcell of claim 1, wherein the third active region is shared with another capacitor of another bitcell.

29. The non-volatile memory bitcell of claim 1, wherein the first active region is formed by blocking well implants using a photoresist having, along a first axis, a first length that is greater than a second length along a second axis perpendicular to the first axis.

30. The non-volatile memory bitcell of claim 1, wherein the third active region is formed by blocking well implants using a photoresist having, along a first axis, a first length that is greater than a second length along a second axis perpendicular to the first axis.

31. The non-volatile memory bitcell of claim 1, wherein the first active region is enclosed by a larger non-active native region than the third active region.

32. The non-volatile memory bitcell of claim 1, wherein the first active region is formed in a region of substrate comprising a shallow well implant.

33. The non-volatile memory bitcell of claim 1, wherein the third active region is formed in a region of substrate comprising a shallow well implant.

34. The non-volatile memory bitcell of claim 1, wherein the first active region further comprises a $V_T$ adjustment implant having a same polarity as the LDD implant.

35. The non-volatile memory bitcell of claim 1, wherein the third active region comprises a LDD implant and a $V_T$ adjustment implant, both implants having a same polarity.

36. A non-transitory machine readable medium comprising instructions that when executed cause a manufacturing facility to create a non-volatile memory bitcell that comprises:
   a tunneling device comprising:
      a first portion of a floating gate above a first active region of a substrate,
      a portion of the first active region beneath the first portion of the floating gate, the first active region being a native region comprising a lightly doped drain (LDD) implant overlapping in the portion of the first active region beneath the first portion of the floating gate, and
      a first insulation layer between the portion of the first active region and the first portion of the floating gate,
      the tunneling device configured to cause charge carriers to transition between the first active region and the first portion of the floating gate responsive to a voltage being applied to the first active region;
   a transistor comprising a source, a drain, and a second portion of the floating gate above a second active region of the substrate, the source and drain formed in the second active region, wherein the source and the drain each comprise a first implant of a first polarity,
      wherein the source comprises a second implant of a second polarity opposite the first polarity, and
      wherein the drain does not include an implant of the second polarity; and
   a capacitor comprising a first plate, a second plate, and a second insulation layer between the first and second plates, the first plate comprising a third portion of the floating gate above a third active region of the substrate, and the second plate comprising a portion of the third active region underneath the third portion of the floating gate.

\* \* \* \* \*